US010680049B2

(12) United States Patent
Udagawa et al.

(10) Patent No.: US 10,680,049 B2
(45) Date of Patent: Jun. 9, 2020

(54) LIGHT EMITTING DEVICE

(71) Applicant: Semiconductor Energy Laboratory Co., Ltd., Atsugi-shi, Kanagawa-ken (JP)

(72) Inventors: Makoto Udagawa, Kanagawa (JP); Masahiko Hayakawa, Kanagawa (JP); Jun Koyama, Kanagawa (JP); Mitsuaki Osame, Kanagawa (JP); Aya Anzai, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 16/358,904

(22) Filed: Mar. 20, 2019

(65) Prior Publication Data
US 2019/0221628 A1    Jul. 18, 2019

Related U.S. Application Data

(60) Continuation of application No. 15/894,981, filed on Feb. 13, 2018, now Pat. No. 10,461,140, which is a
(Continued)

(30) Foreign Application Priority Data

Nov. 9, 2001 (JP) ................................ 2001-344671
Jan. 18, 2002 (JP) ................................ 2002-010766

(51) Int. Cl.
*H01L 27/32*  (2006.01)
*H01L 29/786*  (2006.01)
(Continued)

(52) U.S. Cl.
CPC ...... *H01L 27/3262* (2013.01); *H01L 27/1222* (2013.01); *H01L 27/3276* (2013.01);
(Continued)

(58) Field of Classification Search
CPC ............ H01L 27/3262; H01L 27/1222; H01L 27/3276; H01L 29/78675; H01L 29/8696
See application file for complete search history.

(56) References Cited

U.S. PATENT DOCUMENTS 4,404,578 A   9/1983 Takafuji et al.
5,130,773 A   7/1992 Tsukada
(Continued)

FOREIGN PATENT DOCUMENTS

CN    001213812 A    4/1999
CN    001278109 A    12/2000
(Continued)

OTHER PUBLICATIONS

Search Report (Application No. 02024970.2) dated Jun 2, 2009.
(Continued)

*Primary Examiner* — Nathan W Ha
(74) *Attorney, Agent, or Firm* — Fish & Richardson P.C.

(57) ABSTRACT

The present invention provides a TFT that has a channel length particularly longer than that of an existing one, specifically, several tens to several hundreds times longer than that of the existing one, and thereby allowing turning to an on-state at a gate voltage particularly higher than the existing one and driving, and allowing having a low channel conductance gd. According to the present invention, not only the simple dispersion of on-current but also the normalized dispersion thereof can be reduced, and other than the reduction of the dispersion between the individual TFTs, the dispersion of the OLEDs themselves and the dispersion due to the deterioration of the OLED can be reduced.

6 Claims, 17 Drawing Sheets

Related U.S. Application Data continuation of application No. 15/433,007, filed on Feb. 15, 2017, now Pat. No. 9,905,624, which is a division of application No. 14/730,334, filed on Jun. 4, 2015, now Pat. No. 9,577,016, which is a continuation of application No. 14/172,943, filed on Feb. 5, 2014, now Pat. No. 9,054,199, which is a continuation of application No. 13/689,888, filed on Nov. 30, 2012, now Pat. No. 8,648,338, which is a continuation of application No. 13/432,009, filed on Mar. 28, 2012, now Pat. No. 8,324,618, which is a division of application No. 12/758,862, filed on Apr. 13, 2010, now Pat. No. 8,154,015, which is a division of application No. 10/286,868, filed on Nov. 4, 2002, now Pat. No. 7,723,721.

(51) Int. Cl.
*H01L 51/52* (2006.01)
*H01L 27/12* (2006.01)

(52) U.S. Cl.
CPC .. *H01L 29/78675* (2013.01); *H01L 29/78696* (2013.01); *H01L 51/52* (2013.01); *H01L 27/12* (2013.01); *H01L 27/124* (2013.01)

(56) References Cited

U.S. PATENT DOCUMENTS

| | | |
|---|---|---|
| 5,182,620 A | 1/1993 | Shimada et al. |
| 5,198,153 A | 3/1993 | Angelopoulos et al. |
| 5,200,112 A | 4/1993 | Angelopoulos et al. |
| 5,202,061 A | 4/1993 | Angelopoulos et al. |
| 5,214,497 A | 5/1993 | Nanba et al. |
| 5,373,377 A | 12/1994 | Ogawa et al. |
| 5,519,241 A | 5/1996 | Oppermann et al. |
| 5,608,557 A | 3/1997 | Wu |
| 5,650,636 A | 7/1997 | Takemura et al. |
| 5,703,382 A | 12/1997 | Hack et al. |
| 5,705,826 A | 1/1998 | Aratani et al. |
| 5,721,299 A | 2/1998 | Angelopoulos et al. |
| 5,729,308 A | 3/1998 | Yamazaki et al. |
| 5,744,823 A | 4/1998 | Harkin et al. |
| 5,763,899 A | 6/1998 | Yamazaki et al. |
| 5,814,834 A | 9/1998 | Yamazaki et al. |
| 5,854,139 A | 12/1998 | Aratani et al. |
| 5,879,976 A | 3/1999 | Fujiwara |
| 5,895,935 A | 4/1999 | Yamazaki et al. |
| 5,946,551 A | 8/1999 | Dimitrakopoulos et al. |
| 5,981,970 A | 11/1999 | Dimitrakopoulos et al. |
| 6,023,074 A | 2/2000 | Zhang |
| 6,088,070 A | 7/2000 | Ohtani et al. |
| 6,150,668 A | 11/2000 | Bao et al. |
| 6,166,397 A | 12/2000 | Yamazaki et al. |
| 6,210,479 B1 | 4/2001 | Bojarczuk et al. |
| 6,218,678 B1 | 4/2001 | Zhang et al. |
| 6,229,506 B1 | 5/2001 | Dawson et al. |
| 6,236,063 B1 | 5/2001 | Yamazaki et al. |
| 6,236,064 B1 | 5/2001 | Mase et al. |
| 6,259,117 B1 | 7/2001 | Takemura et al. |
| 6,274,887 B1 | 8/2001 | Yamazaki et al. |
| 6,277,679 B1 | 8/2001 | Ohtani |
| 6,278,127 B1 | 8/2001 | Dodabalapur et al. |
| 6,297,518 B1 | 10/2001 | Zhang |
| 6,307,322 B1 | 10/2001 | Dawson et al. |
| 6,331,356 B1 | 12/2001 | Angelopoulos et al. |
| 6,344,660 B1 | 2/2002 | Dimitrakopoulos et al. |
| 6,344,662 B1 | 2/2002 | Dimitrakopoulos et al. |
| 6,380,672 B1 | 4/2002 | Yudasaka |
| 6,384,427 B1 | 5/2002 | Yamazaki et al. |
| 6,399,520 B1 | 6/2002 | Kawakami et al. |
| 6,417,896 B1 | 7/2002 | Yamazaki et al. |
| 6,420,200 B1 | 7/2002 | Yamazaki et al. |
| 6,433,371 B1 | 8/2002 | Scholer et al. |
| 6,445,005 B1 | 9/2002 | Yamazaki et al. |
| 6,462,722 B1 | 10/2002 | Kimura et al. |
| 6,469,318 B2 | 10/2002 | Yamada et al. |
| 6,495,858 B1 | 12/2002 | Zhang |
| 6,501,466 B1 | 12/2002 | Yamagishi et al. |
| 6,516,069 B1 | 2/2003 | Takeuchi et al. |
| 6,522,079 B1 | 2/2003 | Yamada |
| 6,531,713 B1 | 3/2003 | Yamazaki |
| 6,548,867 B2 | 4/2003 | Yamada et al. |
| 6,559,594 B2 | 5/2003 | Fukunaga et al. |
| 6,573,162 B2 | 6/2003 | Tanaka et al. |
| 6,580,094 B1 | 6/2003 | Yamazaki et al. |
| 6,583,775 B1 | 6/2003 | Sekiya et al. |
| 6,583,776 B2 | 6/2003 | Yamazaki et al. |
| 6,593,691 B2 | 7/2003 | Nishi et al. |
| 6,593,990 B1 | 7/2003 | Yamazaki |
| 6,597,014 B1 | 7/2003 | Yamazaki et al. |
| 6,603,139 B1 | 8/2003 | Tessler et al. |
| 6,611,037 B1 * | 8/2003 | Rhodes ............ H01L 27/14601 257/462 |
| 6,614,054 B1 | 9/2003 | Ahn |
| 6,642,651 B2 | 11/2003 | Yudasaka |
| 6,670,637 B2 | 12/2003 | Yamazaki et al. |
| 6,680,577 B1 | 1/2004 | Inukai et al. |
| 6,700,330 B2 | 3/2004 | Koyama |
| 6,702,407 B2 | 3/2004 | Azami |
| 6,714,268 B2 | 3/2004 | Wang et al. |
| 6,727,522 B1 | 4/2004 | Kawasaki et al. |
| 6,734,836 B2 | 5/2004 | Nishitoba |
| 6,746,770 B2 | 6/2004 | Afzali-Ardakani et al. |
| 6,768,260 B2 | 7/2004 | Fukunaga et al. |
| 6,774,574 B1 | 8/2004 | Koyama |
| 6,777,255 B2 | 8/2004 | Yamazaki |
| 6,777,710 B1 | 8/2004 | Koyama |
| 6,777,887 B2 | 8/2004 | Koyama |
| 6,781,153 B2 | 8/2004 | Anzai |
| 6,781,155 B1 | 8/2004 | Yamada |
| 6,784,454 B2 | 8/2004 | Anzai |
| 6,791,129 B2 | 9/2004 | Inukai |
| 6,798,405 B2 | 9/2004 | Anzai |
| 6,801,180 B2 | 10/2004 | Matsueda |
| 6,809,343 B2 | 10/2004 | Yamazaki et al. |
| 6,825,488 B2 | 11/2004 | Yamazaki et al. |
| 6,872,910 B2 | 3/2005 | Tanaka et al. |
| 6,876,346 B2 | 4/2005 | Anzai et al. |
| 6,885,027 B2 | 4/2005 | Takemura et al. |
| 6,885,148 B2 | 4/2005 | Yudasaka |
| 6,894,312 B2 | 5/2005 | Yamazaki et al. |
| 6,900,507 B1 | 5/2005 | Hong |
| 6,909,114 B1 | 6/2005 | Yamazaki |
| 6,914,642 B2 | 7/2005 | Yamazaki et al. |
| 6,916,692 B2 | 7/2005 | Moore |
| 6,919,886 B2 | 7/2005 | Sato et al. |
| 6,958,251 B2 | 10/2005 | Yamazaki et al. |
| 6,967,236 B1 | 11/2005 | Angelopoulos et al. |
| 6,995,520 B2 | 2/2006 | Inukai |
| 6,999,149 B2 | 2/2006 | Miyajima et al. |
| 7,045,438 B2 | 5/2006 | Yamazaki et al. |
| 7,053,890 B2 | 5/2006 | Inukai |
| 7,053,918 B2 | 5/2006 | Azami |
| 7,061,186 B2 | 6/2006 | Inukai et al. |
| 7,064,346 B2 | 6/2006 | Kawasaki et al. |
| 7,095,474 B2 | 8/2006 | Angelopoulos et al. |
| 7,101,242 B2 | 9/2006 | Fukunaga et al. |
| 7,102,163 B2 | 9/2006 | Anzai |
| 7,129,917 B2 | 10/2006 | Yamazaki et al. |
| 7,148,506 B2 | 12/2006 | Zhang |
| 7,202,881 B2 | 4/2007 | Azami |
| 7,208,765 B2 | 4/2007 | Yamazaki et al. |
| 7,211,828 B2 | 5/2007 | Yamazaki et al. |
| 7,262,400 B2 * | 8/2007 | Yaung ............ H01L 27/14621 250/208.1 |
| 7,268,062 B2 | 9/2007 | Tanaka et al. |
| 7,279,752 B2 | 10/2007 | Yamazaki et al. |
| 7,342,251 B2 | 3/2008 | Yamazaki et al. |
| 7,358,531 B2 | 4/2008 | Koyama |
| 7,364,939 B2 | 4/2008 | Yudasaka |
| 7,427,528 B2 | 9/2008 | Koh |
| 7,442,592 B2 | 10/2008 | Ichijo et al. |

(56) References Cited

U.S. PATENT DOCUMENTS

| | | |
|---|---|---|
| 7,459,724 B2 | 12/2008 | Zhang |
| 7,518,146 B2 | 4/2009 | Yamazaki et al. |
| 7,642,559 B2 | 1/2010 | Yamazaki et al. |
| 7,683,535 B2 | 3/2010 | Fukunaga et al. |
| 7,701,134 B2 | 4/2010 | Yamazaki et al. |
| 7,723,721 B2 | 5/2010 | Udagawa et al. |
| 7,741,775 B2 | 6/2010 | Yamazaki et al. |
| 7,745,993 B2 | 6/2010 | Fukunaga et al. |
| 7,799,590 B2 | 9/2010 | Yamazaki et al. |
| 7,867,053 B2 | 1/2011 | Fukunaga et al. |
| 7,982,222 B2 | 7/2011 | Koyama |
| 8,017,456 B2 | 9/2011 | Yamazaki et al. |
| 8,154,015 B2 | 4/2012 | Udagawa et al. |
| 8,159,124 B2 | 4/2012 | Yudasaka |
| 8,227,809 B2 | 7/2012 | Yamazaki et al. |
| 8,324,618 B2 | 12/2012 | Udagawa et al. |
| 8,513,666 B2 | 8/2013 | Yamazaki et al. |
| 8,581,806 B2 | 11/2013 | Sato et al. |
| 8,604,704 B2 | 12/2013 | Kimura |
| 8,648,338 B2 | 2/2014 | Udagawa et al. |
| 8,785,949 B2 | 7/2014 | Yamazaki et al. |
| 9,054,199 B2 | 6/2015 | Udagawa et al. |
| 9,577,016 B2 | 2/2017 | Udagawa et al. |
| 9,905,624 B2 | 2/2018 | Udagawa et al. |
| 2001/0030323 A1 | 10/2001 | Ikeda |
| 2001/0038098 A1 | 11/2001 | Yamazaki et al. |
| 2002/0025391 A1 | 2/2002 | Angelopoulos et al. |
| 2002/0047568 A1 | 4/2002 | Koyama |
| 2002/0068372 A1 | 6/2002 | Kunii |
| 2002/0079512 A1 | 6/2002 | Yannazaki et al. |
| 2002/0097350 A1 | 7/2002 | Haven et al. |
| 2002/0153844 A1 | 10/2002 | Koyama |
| 2003/0016196 A1 | 1/2003 | Lueder et al. |
| 2003/0025118 A1 | 2/2003 | Yamazaki et al. |
| 2003/0062499 A1 | 4/2003 | Yamazaki |
| 2003/0089905 A1 | 5/2003 | Udagawa et al. |
| 2003/0146888 A1 | 8/2003 | Yamazaki et al. |
| 2003/0164522 A1 | 9/2003 | Kato et al. |
| 2003/0203523 A1 | 10/2003 | Yamazaki et al. |
| 2003/0222589 A1 | 12/2003 | Osame et al. |
| 2004/0003939 A1 | 1/2004 | Nishi et al. |
| 2004/0065902 A1 | 4/2004 | Yamazaki et al. |
| 2004/0266042 A1 | 12/2004 | Yamazaki |
| 2005/0127380 A1 | 6/2005 | Kawasaki et al. |
| 2005/0161672 A1 | 7/2005 | Yamazaki et al. |
| 2005/0269606 A1 | 12/2005 | Mouli |
| 2005/0282317 A1 | 12/2005 | Ikeda |
| 2006/0097256 A1 | 5/2006 | Yamazaki et al. |
| 2006/0192205 A1 | 8/2006 | Yamazaki et al. |
| 2006/0194415 A1 | 8/2006 | Lee et al. |
| 2006/0238116 A1 | 10/2006 | Angelopoulos et al. |
| 2006/0238690 A1 | 10/2006 | Angelopoulos et al. |
| 2006/0286889 A1 | 12/2006 | Nishi et al. |
| 2007/0057624 A1 | 3/2007 | Angelopoulos et al. |
| 2007/0077371 A1 | 4/2007 | Dimitrakopoulos et al. |
| 2007/0110921 A1 | 5/2007 | Angelopoulos et al. |
| 2009/0026970 A1 | 1/2009 | Ohtani |
| 2010/0203665 A1 | 8/2010 | Park |
| 2011/0101852 A1 | 5/2011 | Fukunaga et al. |
| 2011/0260172 A1 | 10/2011 | Koyama |
| 2012/0299471 A1 | 11/2012 | Yamazaki et al. |

FOREIGN PATENT DOCUMENTS

| | | |
|---|---|---|
| CN | 001279519 A | 1/2001 |
| CN | 001301400 A | 6/2001 |
| EP | 0399299 A | 11/1990 |
| EP | 0450941 A | 10/1991 |
| EP | 0556989 A | 8/1993 |
| EP | 0567835 A | 11/1993 |
| EP | 0721214 A | 7/1996 |
| EP | 0940797 A | 9/1999 |
| EP | 0962984 A | 12/1999 |
| EP | 1037093 A | 9/2000 |
| EP | 1058311 A | 12/2000 |
| EP | 1061497 A | 12/2000 |
| EP | 1063630 A | 12/2000 |
| EP | 1065725 A | 1/2001 |
| EP | 1085576 A | 3/2001 |
| EP | 1087336 A | 3/2001 |
| EP | 1087366 A | 3/2001 |
| EP | 1096303 A | 5/2001 |
| EP | 1096571 A | 5/2001 |
| EP | 1102234 A | 5/2001 |
| EP | 1103946 A | 5/2001 |
| EP | 1103947 A | 5/2001 |
| EP | 1109225 A | 6/2001 |
| EP | 1122800 A | 8/2001 |
| EP | 1134811 A | 9/2001 |
| EP | 1150273 A | 10/2001 |
| EP | 1178462 A | 2/2002 |
| EP | 1193676 A | 4/2002 |
| EP | 1193741 A | 4/2002 |
| EP | 1207511 A | 5/2002 |
| EP | 1310997 A | 5/2003 |
| EP | 1505648 A | 2/2005 |
| EP | 1562231 A | 8/2005 |
| EP | 1615275 A | 1/2006 |
| EP | 1684367 A | 7/2006 |
| EP | 1703568 A | 9/2006 |
| EP | 1717859 A | 11/2006 |
| EP | 1746659 A | 1/2007 |
| EP | 1770779 A | 4/2007 |
| EP | 2154718 A | 2/2010 |
| EP | 2256718 A | 12/2010 |
| EP | 2262031 A | 12/2010 |
| EP | 2276067 A | 1/2011 |
| EP | 2372682 A | 10/2011 |
| JP | 54-008986 A | 1/1979 |
| JP | 56-026468 A | 3/1981 |
| JP | 62-092370 A | 4/1987 |
| JP | 02-058030 A | 2/1990 |
| JP | 02-194561 A | 8/1990 |
| JP | 03-288824 A | 12/1991 |
| JP | H03-288824 | 12/1991 |
| JP | 05-190284 A | 7/1993 |
| JP | 05-205873 A | 8/1993 |
| JP | 06-053441 A | 2/1994 |
| JP | 06-148688 A | 5/1994 |
| JP | H06-148688 | 5/1994 |
| JP | 07-169868 A | 7/1995 |
| JP | 08-018125 A | 1/1996 |
| JP | 08-054837 A | 2/1996 |
| JP | 08-204196 A | 8/1996 |
| JP | 08-213627 A | 8/1996 |
| JP | 08-234683 A | 9/1996 |
| JP | 08-236780 A | 9/1996 |
| JP | 08-279616 A | 10/1996 |
| JP | 09-102615 A | 4/1997 |
| JP | 09-162414 A | 6/1997 |
| JP | 09-166788 A | 6/1997 |
| JP | 09-246563 A | 9/1997 |
| JP | 09-246566 A | 9/1997 |
| JP | H09-246563 | 9/1997 |
| JP | 09-293879 A | 11/1997 |
| JP | 10-135481 A | 5/1998 |
| JP | 10-148847 A | 6/1998 |
| JP | 10-254410 A | 9/1998 |
| JP | 10-270712 A | 10/1998 |
| JP | 11-133463 A | 5/1999 |
| JP | 11-194363 A | 7/1999 |
| JP | 11-284443 A | 10/1999 |
| JP | 11-515143 | 12/1999 |
| JP | H11-515143 | 12/1999 |
| JP | 2000-029403 A | 1/2000 |
| JP | 2000-505249 | 4/2000 |
| JP | 2000-137246 A | 5/2000 |
| JP | 2000-150895 A | 5/2000 |
| JP | 2000-150900 A | 5/2000 |
| JP | 2000-214800 A | 8/2000 |
| JP | 2000-223279 A | 8/2000 |
| JP | 2000-243963 A | 9/2000 |
| JP | 2000-259098 A | 9/2000 |
| JP | 2000-306680 A | 11/2000 |

(56) References Cited

FOREIGN PATENT DOCUMENTS

| | | |
|---|---|---|
| JP | 2000-340798 A | 12/2000 |
| JP | 2000-347624 A | 12/2000 |
| JP | 2000-352941 A | 12/2000 |
| JP | 2001-005426 A | 1/2001 |
| JP | 2001-051622 A | 2/2001 |
| JP | 2001-060076 A | 3/2001 |
| JP | 2001-076873 A | 3/2001 |
| JP | 2001-109405 | 4/2001 |
| JP | 2001-109405 A | 4/2001 |
| JP | 2001-111053 A | 4/2001 |
| JP | 2001-119032 A | 4/2001 |
| JP | 2001-147659 A | 5/2001 |
| JP | 2001-195015 A | 7/2001 |
| JP | 2001-195016 A | 7/2001 |
| JP | 2001-203368 A | 7/2001 |
| JP | 2001-222240 A | 8/2001 |
| JP | 2001-223166 A | 8/2001 |
| JP | 2001-236027 A | 8/2001 |
| JP | 2001-238287 A | 8/2001 |
| JP | 2001-244213 A | 9/2001 |
| JP | 2001-272930 A | 10/2001 |
| JP | 2001-281704 | 10/2001 |
| JP | 2001-281704 A | 10/2001 |
| JP | 2001-284592 A | 10/2001 |
| JP | 2001-285036 A | 10/2001 |
| JP | 2001-290457 A | 10/2001 |
| JP | 2001-291595 A | 10/2001 |
| JP | 2001-296818 A | 10/2001 |
| JP | 2001-343933 A | 12/2001 |
| JP | 2002-023697 A | 1/2002 |
| JP | 2002-082651 A | 3/2002 |
| JP | 2002-108285 A | 4/2002 |
| JP | 2002-124377 A | 4/2002 |
| JP | 2002-512451 | 4/2002 |
| JP | 2002-175029 A | 6/2002 |
| JP | 2002-176063 A | 6/2002 |
| JP | 2002-287698 A | 10/2002 |
| JP | 2003-208110 A | 7/2003 |
| KR | 1999-0077188 A | 10/1999 |
| KR | 2001-0093719 A | 10/2001 |
| KR | 10-0436654 | 6/2004 |
| TW | 468268 | 12/2001 |
| TW | 491983 | 6/2002 |
| TW | 498395 | 8/2002 |
| WO | WO-1997/015948 | 5/1997 |
| WO | WO-1998/021755 | 5/1998 |
| WO | WO-1998/036407 | 8/1998 |
| WO | WO-1998/048403 | 10/1998 |
| WO | WO-1999/010862 | 3/1999 |
| WO | WO-1999/010939 | 3/1999 |
| WO | WO-1999/054936 | 10/1999 |
| WO | WO-2000/030183 | 5/2000 |
| WO | WO-2001/017029 | 3/2001 |
| WO | WO-2001/048822 | 7/2001 |
| WO | WO-2001/073738 | 10/2001 |

OTHER PUBLICATIONS

Office Action (Application No. 2002-0069441) dated Feb. 5, 2009.
Office Action (Application No. 91132611) dated Aug. 15, 2007.
Sanford.J et al., "24.2 Direct View Active Matrix VGA OLED-on-Crystalline-Sillicon Display", SID DIGEST '01: SID International Symposium Digest of Technical Papers, 2001, vol. 32, pp. 376-379.
Tosic.N et al., "High Voltage Effects in Top Gate Amorphous Silicon Thin Film Transistors", Mat. Res. Soc. Symp. Proc. (Materials Research Society Symposia Proceedings), 2000, vol. 621, pp. Q8.5.1-Q8.5.6.
Wolf.S, Silicon Processing for the VLSI Era, 1990, vol. 2, p. 307, Lattice Press.
Chinese Office Action (Application No. 201110330443.3) dated Oct. 18, 2013.
Chinese Office Action (Application No. 201110330443.3) dated Mar. 21, 2014.
Wang.A et al., "A Strategy for Modeling of Variations due to Grain Size in Polycrystalline Thin-Film Transistors", IEEE Transactions on Electron Devices, May 1, 2000, vol. 47, No. 5, pp. 1035-1043.
European Official Communication (Application No. 02024970.2) dated Nov. 13, 2014.

\* cited by examiner

LIGHT EMITTING DEVICE

CROSS-REFERENCE TO RELATED APPLICATIONS

This application is a continuation of U.S. application Ser. No. 15/894,981, filed Feb. 13, 2018, which is a continuation of U.S. application Ser. No. 15/433,007, filed Feb. 15, 2017, now U.S. Pat. No. 9,905,624, which is a divisional of U.S. application Ser. No. 14/730,334, filed Jun. 4, 2015, now U.S. Pat. No. 9,577,016, which is a continuation of U.S. application Ser. No. 14/172,943, filed Feb. 5, 2014, now U.S. Pat. No. 9,054,199, which is a continuation of U.S. application Ser. No. 13/689,888, filed Nov. 30, 2012, now U.S. Pat. No. 8,648,338, which is a continuation of U.S. application Ser. No. 13/432,009, filed Mar. 28, 2012, now U.S. Pat. No. 8,324,618, which is a divisional of U.S. application Ser. No. 12/758,862, filed Apr. 13, 2010, now U.S. Pat. No. 8,154,015, which is a divisional of U.S. application Ser. No. 10/286,868, filed Nov. 4, 2002, now U.S. Pat. No. 7,723,721, which claims the benefit of a foreign priority application filed in Japan as Serial No. 2001-344671 on Nov. 9, 2001, and Serial No. 2002-010766 on Jan. 18, 2002, all of which are incorporated by reference.

BACKGROUND OF THE INVENTION

1. Field of the Invention

The present invention relates to the manufacturing method of semiconductor device, in particular, present invention relates to a light emitting device comprising an organic light emitting device (OLED) formed over a substrate having an insulating surface. The invention also relates to an OLED module in which ICs including a controller, or the like, is mounted with an OLED panel. Note that, in this specification, the light emitting device includes the OLED panel and for the OLED module. Electronic equipment using the light emitting device is also included in the present invention.

Noted that in the present specification, the term "semiconductor device" generally indicates a device which is capable of functioning by utilizing semiconductor characteristics, and a light emitting device, an electro-optical device, a semiconductor circuit and an electronic device are all included in the semiconductor device.

2. Description of the Related Art

Recently, technology for forming TFTs (Thin Film Transistor) over a substrate has been greatly progressed, and its application to an active matrix display device is actively developed. In particular, a TFT using a polysilicon film have a higher field effect mobility (also referred to as mobility) than that of a conventional TFT using an amorphous silicon film, and thus, is capable of high-speed operations. Therefore, a driving circuits that consist of TFTs using a polysilicon film is provided over the same substrate as pixels, and the development for controlling respective pixels is performed actively. Since driving circuits and pixels over one substrate are incorporated into an active matrix display device, there are various advantages such as reduction in the manufacturing cost, miniaturization of the display device, improvement in yield, and improvement in throughput.

In addition, an active matrix light emitting device (hereinafter, simply referred to as light emitting device), which has as a self-luminous element an OLED is actively researched. The light emitting device is also referred to as organic EL displays (OELDs) or organic light emitting diodes (OLEDs).

An OLED is self-luminous to have high visibility, and is optimal for making a display thin since a backlight like used for a liquid crystal display (LCD) is not required. Further, an angle of view has no limits. Therefore, a light emitting device using an OLED has thus come under the spotlight as a substitute display device for CRTs and LCDs.

An active matrix driving system for displaying an image by arranging a plurality of TFTs in each pixel and sequentially writing a video signal is known as one mode of a light emitting device using OLED elements. The TFT is an indispensable element for realizing the active matrix driving system.

In addition, for the purpose of realizing the active matrix driving system, in the light emitting device using OLED, since TFT controls current amount flowing through OLED, it can not realized when TFT that uses low current effect mobility amorphous silicon is adopted. It is preferable that the semiconductor film having a crystallizing structure, typically, TFT using polysilicon is adopted to connect to OLED.

The semiconductor film having crystalline structure, typically, a polysilicon film is used to form TFT, and pixels and driving circuits are formed integrally over the same substrate, thereby the number of connecting terminals is dramatically reduced and a frame area (the periphery portion of the pixel portion) is also reduced.

However, even when the TFT is formed by using the polysilicon, its electrical characteristics are finally not equivalent to the characteristics of a MOS transistor formed in a single crystalline silicon substrate. For example, the electric field effect mobility of a conventional TFT is equal to or smaller than $\frac{1}{10}$ in comparison with the single crystalline silicon. Further, the TFT using polysilicon has a problem that is dispersion is caused easily in its characteristics due to a defect formed in a boundary of a crystal grain.

In the light emitting device, at least a TFT functioning as a switching element and a TFT for supplying an electric current to an OLED are generally arranged in each pixel. A low off-electric current ($I_{off}$) is required in the TFT functioning as the switching element while high driving ability (an on-electric current $I_{on}$), the prevention of deterioration due to a hot carrier effect and the improvement of reliability are required in the TFT for supplying the electric current to the OLED. Further, high driving ability (the on-electric current $I_{on}$), the prevention of deterioration due to the hot carrier effect and the improvement of reliability are also required in the TFT of the data line driving circuit.

Moreover, since the luminance of a pixel is determined by the ON current ($I_{on}$) of TFT which is electrically connected with an OLED and supplies current to the EL element without depending on the drive method, there is a problem dispersion is caused in luminance if ON current is not constant in case of displaying white on overall surface. For example, in case of adjusting luminance by light emitting time and performing 64 gray scales, the ON current of the TFT which is electrically connected with the EL element and supplies current to the OLED is dispersed 1.56% ($=\frac{1}{64}$) from a fiducial point to shift one gray scale.

Moreover, when OLED is formed, the gap of EL layer pattering and unevenness of the thickness of EL layer disorder the substrate. There is a slightly variation in luminosity. This invention makes it the subject to be made in view of the above-mentioned problem, to reduce the characteristic variation of each TFT, and to reduce the variation in luminosity.

Moreover, it is also making into the subject to reduce the variation in OLED which is not related to the characteristic variation of TFT, and to reduce the variation in luminosity.

SUMMARY OF THE INVENTION

Moreover, in conventional active matrix type light emitting device, when resolution is tried to be raised, the problem that the aperture rate was restricted by arrangement of electrode for the retention capacitance in a pixel portion and the wiring for retention capacitance, TFT, various wiring, and the like had occurred. This invention aims at offering the pixel structure which raises the aperture rate in a pixel portion.

As one of typical indicators of TFT characteristics, a V-I characteristics graph is known. At a position where a build-up in the V-I characteristics curve is most precipitous (it is also called as a rising point), value of electric current changes most. Accordingly, in the case that an electric current supplied to an OLED is controlled by a TFT, the value of electric current of the TFT that supplies the current to the OLED largely disperses when the rising point disperses.

The value of voltage at the rising point is called as threshold voltage ($V_{th}$) and is a voltage by which the TFT is switched to an on-state. Furthermore, in general, it is regarded that the closer to zero the $V_{th}$, is, the better it is. It is regarded that when the $V_{th}$ becomes larger, an increase in a driving voltage and in power consumption may be caused.

There are two kinds of dispersions in the electric current value of the TFT. Specifically, one is the simple dispersion 3 sigma of the electric current value and the other is the dispersion with respect to a medium value (average value) of the electric current values in an ensemble of a particular number of TFTs (in the present specification, this dispersion is also called as a normalized dispersion).

The present inventors have found that there is a tendency that the latter dispersion depends strongly on gate voltage value (Vg). In FIG. 3, relationship between Vgs in p-channel type TFTs (channel width W=8 µm) of various channel lengths (5 µm, 10 µm, 20 µm, 50 µm, 100 µm, 200 µm and 400 µm) and normalized dispersions is shown. Furthermore, in FIG. 4, relationship between Vgs in n-channel type TFTs (channel width W=8 µm) of various channel lengths and normalized dispersions is shown.

With experimental data of the TFTs, the present invention will now be described in detail.

When the channel length of the TFT that supplies an electric current to the OLED is made longer, the value of electric current becomes smaller and the simple dispersion 3 sigma decreases. TFTs are prepared with Vd set at −7V and Vg at −3.25 V and with the channel width fixed at 8 µm, and with the channel length varying in 50 µm, 100 µm, 200 µm and 400 µm, respectively. With each of the TFTs, the dispersion of on-current and normalized dispersion are measured. These measurements are shown in FIG. 11. However, as shown in FIG. 11, when only the channel length is made longer, the current value becomes smaller, but the dispersion with respect to the medium value of the electric currents in an ensemble of a particular number of TFTs (normalized dispersion) does not change.

In the present invention, in order to make the dispersion lower, a TFT is designed to have such a long channel length as to be ten times or more or several hundreds times or more longer than ever so that the TFT may be turned to an on-state at a particularly higher gate voltage, and furthermore a gate voltage that is input from the outside is set to drive.

The TFTs whose Vd is set at −7V, channel width is fixed at 8 µm, and channel length is set at 50 µm are measured of the dispersions of the on-currents and the normalized dispersions thereof at Vg=−3V, respectively. Subsequently, in a similar manner, the TFTs whose channel length is 100 µm are measured at Vg=−3.75 V, the TFTs whose channel length is 200 µm are measured at Vg=−3.75 V, and the TFTs whose channel length is 400 µm are measured at Vg=−5.75 V. Measurement results are shown in FIG. 2.

As shown in FIG. 2, as the channel length is made longer and thereby the gate voltage (Vg) is made larger, not only the simple dispersion of on-current but also the normalized dispersion can be reduced. In this example, in order to make the Vg larger, the TFT having longer channel length is used. However, it is not restricted to the above but, in order to make the Vg larger, within permissible design limits, for instance, the channel width W may be made shorter, a source region or a drain region of the TFT may be made highly resistive, or a contact resistance may be made higher.

Furthermore, the present invention provides a TFT whose channel length is much longer, specifically, several tens of to several hundreds of times longer than that of the related art, so that the TFT may be turned to an on-state at a gate voltage much higher than ever to drive and may have low channel conductance gd. FIG. 1 shows data corresponding to FIG. 2 and is a graph showing channel conductance gd of individual TFTs under the same conditions (Vg, the channel width, and the channel length) as the data of FIG. 2.

In the present invention, when a TFT that supplies a current to an OLED is made such that in the range that the sum of source-drain voltage Vd and threshold voltage Vth is larger than gate voltage Vg, that is, in the range of Vg< (Vd+Vth), channel conductance is from 0 to $1\times10^{-8}$ S, preferably $5\times10^{-9}$ S or less, further preferably $2\times10^{-9}$ S or less so that dispersion of the current that flows to the TFT can be reduced, and a certain constant current can be flowed to the OLED.

In addition to the above, resulting from the smaller channel conductance gd, the dispersion of the OLEDs themselves caused by an area contraction in an EL layer due to a patterning or heat treatment can be also reduced. Furthermore, by making the channel conductance gd smaller, even when the OLED may be deteriorated for some reason, the current flowing to the OLED can be maintained at a constant value, resulting in maintaining a constant brightness. In FIG. 12, Id-Vd curves and load curves of the OLED are shown. The channel conductance gd indicates a gradient of the Id-Vd curve, and as the channel conductance gd is made smaller, the gradient of the Id-Vd curve becomes smaller, resulting in a substantially constant current value. In FIG. 12, the load curves of the OLED are curves showing relationship between the current value that is input to the OLED and the Vd when Vg=−3.3 V and a p-channel TFT connected to the OLED is driven in a saturation region. For instance, when −Vd is −17 V, since a voltage on a cathode side is −17 V, a voltage that is input to the OLED is 0 V. Accordingly, a current that is input to the OLED becomes also zero. Furthermore, the current value at an intersection point of the Id-Vd curve and the load curve of the OLED corresponds to the brightness. In FIG. 12, when the gd is smaller, there is an intersection point where −Vd is −7 V. At that time, the current value that is input to the OLED is $1\times10^{-6}$ [A], and luminescence of the brightness corresponding to this current value can be obtained. When the gd is smaller, to whichever side of a right side and a left side the load curve of the OLED may be moved, the current value hardly change, resulting in a uniform brightness. Furthermore, when an individual OLED itself disperses, the load curve thereof moves to either the right side or the left side. Furthermore, when the OLED deteriorates, the load curve of the OLED shifts to the left side. In the case that the gd is larger, when the load curve of the OLED shifts to the left side because of the deterioration and becomes a curve shown with a dotted line, an intersection point with the load curve of the OLED varies, resulting in different current values before and after the deterioration. On the other hand, in the case that the gd is smaller, even when the load curve of the OLED shifts to the left side because of the deterioration, the current value hardly changes so that the dispersion of the brightness is reduced, resulting in a uniform brightness.

Here, in order to make the channel conductance gd lower, the channel length is made longer, and thereby the TFT is turned to an on-state at a voltage much higher than in the related art to be driven. However, by other means, the channel conductance gd may be further lowered. For instance, the channel conductance gd may be in lowered by forming the TFT in a LDD structure, or by dividing a channel forming region into a plurality of sub-regions.

Most n-channel TFTs of, pixels for use in liquid crystal panels are of size channel length L×channel width W=12 m×4 m and L×W=12 µm×6 µm. In general, in order to improve an open area ratio, it is regarded that the smaller an area that the TFT occupies in a pixel, that is, an occupation area, is, the better it is. Accordingly, it has been difficult to think of making the channel length such long as 100 µm or more. Furthermore, it is found that, as shown in FIG. 4, in the case that the channel length is 5 µm or 10 µm, the Vg least disperses in the range of 8 V to 10 V and there is an increasing tendency in the dispersion when the Vg is 10 V or more. Accordingly, it could not be thought of that, in the case that the channel length is made 100 µm or more, the larger the Vg is, the less the dispersion becomes.

Furthermore, when the channel length is made 100 µm or more, various shapes can be thought of as a semiconductor layer. Typical examples, include a shape in which a semiconductor layer 102 snakes in an X direction as shown in FIG. 6 (it is referred to as A type in the present specification), a shape in which a semiconductor layer 1102 snakes in a Y direction as shown in FIG. 13A (it is referred to as B type in the present specification), and a rectangular shape (a semiconductor layer 1202) as shown in FIG. 13B.

Still furthermore, when the channel length is made longer, in the case that a laser beam radiation process is applied as one of steps for forming the TFT, the dispersion of the laser beam can be also reduced. With each of combinations of the TFT sizes and the semiconductor layer shapes of L×W=87 µm×7 µm (rectangular shape), L×W=165 µm×7 µm (rectangular shape), L×W=88 µm×4 µm (rectangular shape), L×W=165 µm×4 µm (rectangular shape), L×W=500 µm×4 µm (A type), and L×W=500 µm×4 µm (B type), and furthermore with a scanning speed of the laser beam set at 1 mm/sec or 0.5 mm/sec, the TFTs are prepared. With these TFTs, experiments are conducted to study the relationship between the TFT size and the shape of the semiconductor layer, and the dispersion (3 sigma) of the on-current of the TFT. Here, the laser beam is radiated to improve the crystallinity of polysilicon. In FIG. 18, experimental results in the case of the gate voltage Vg=−5 V and Vd=−6 V are shown, and in FIG. 19, experimental results in the case of the gate voltage Vg=−10 V and Vd=−6 V are shown. In FIGS. 18 and 19, medium values (µA) of the on-currents are also shown. Furthermore, relationship between the TFT size and the shape of the semiconductor layer, and the dispersion (3 sigma) of the threshold value (Vth) of the TFT is obtained and shown in FIG. 20.

From FIGS. 18 and 19, it can be read that there is a tendency that the longer the channel length L is, the smaller the dispersion of the on-currents is. The dispersion of the laser beam is smaller in the laser scanning speed 0.5 mm/sec than in 1 mm/sec, and the longer the channel length L is made, the smaller the difference of the dispersions of the different laser scanning speeds becomes. That is, it can be regarded that the longer the channel length L is made, the more the dispersion of the laser light can be reduced. Furthermore, it can be read that one whose dispersion is most reduced is L×W=500 µm×4 µm, and the dispersion of the on-current is smaller in the A type than in the B type.

In view of the above, from FIGS. 18 and 19, it can be seen that the dispersion of the brightness of a light emitting device in which the TFT that supplies a current to the OLED is operated in a voltage range until a saturation region is attained can be reduced.

Furthermore, when compared with the current value flowing to the TFT fixed at a constant value, the channel width W is better to be smaller. FIG. 21 shows a graph showing the dispersions when the current values are fixed at a constant value (Id=0.5 µA). From FIG. 21, it can be seen that the dispersion of the brightness of the light emitting device in which the TFT that supplies the current to the OLED is operated in the saturation region can be reduced. Furthermore, similarly, it can be read that the dispersion is most reduced in L×W=500 µm×4 µm, and the on-current of the A type disperses less than the B type.

Still furthermore, FIG. 20 also tells that there is a tendency that the longer the channel length L is, the less the dispersion of the threshold voltage (Vth) is.

Furthermore, since as the channel length L is made longer, the dispersions of both the threshold values and on-currents, that is, electric characteristics of the TFT, are reduced, it can be regarded that not only the dispersion of the laser beam is reduced but also the dispersion resulting from other processes is reduced.

Still furthermore, also in a light emitting device having an OLED, it is regarded that the smaller the occupation area of the TFT that is provided to the pixel is, the better the TFT is. Since the existing TFT size is small, the dispersion in the individual TFT characteristics is large and is a main reason of the display irregularity in a display device.

In the case of the current flowing to the OLED being controlled with the TFT, largely divided, there are two methods. Specifically, one is a method that controls the current in a voltage range called the saturation region and the other one is a method that controls the current in the voltage range until the saturation region is attained. When, as shown in FIG. 9, with a certain constant gate voltage applied and with a source-drain voltage Vd gradually raising, current values flowing between the source and the drain are measured, and thereby a Vd-Id curve of a TFT is obtained, a graph in which the current value becomes a substantially constant above a certain value of Vd is obtained. In the present specification, in the Vd-Id curve, a range where the current value becomes substantially constant is called a saturation region.

The present invention is also effective even when the TFT that supplies the current to the OLED is operated in the voltage range until the saturation region is attained. However, in particular, when the TFT that supplies the current to the OLED is operated in the saturation region and thereby the current flowing to the OLED is maintained constant, an effect of reducing the dispersion is remarkable.

Furthermore, it is preferable to use the p-channel type TFT whose dispersion is more reduced than the n-channel type TFT, as shown in FIGS. 3 and 4, for the TFT that supplies the current to the OLED. However, in the present invention, the TFT that supplies the current to the OLED may be either one of the n-channel type TFT and the p-channel type TFT. In the case of the TFT that supplies the current to the OLED being, for instance, the p-channel type TFT, a connection need only be performed as shown in FIG. 10A. Furthermore, in the case of the TFT that supplies the current to the OLED being, for instance, the n-channel type TFT, a connection need only be implemented as shown in FIG. 10B. In each of FIGS. 10A and 10B, although only the TFT that supplies the current to the OLED is shown, it goes without saying that after the gate electrode of the TFT, various circuits made of a plurality of TFTs may be disposed. That is, the circuit configuration is not restricted to particular one.

One configuration of the invention that is disclosed in the present specification is a light emitting device having a light emitting element, the light emitting element including:
a cathode;
an organic compound layer in contact with the cathode; and
an anode in contact with the organic compound layer;
wherein a channel length L of a TFT connected to the light emitting element is 100 µm or more, and preferably is from 100 µm to 500 µm.

In the configuration, a ratio of a channel width W of the TFT to the channel length L thereof is from 0.1 to 0.01.

Another configuration of the invention that is disclosed in the present specification is a light emitting device having a light emitting element, the light emitting element, including:
a cathode;
an organic compound layer in contact with the cathode; and
an anode in contact with the organic compound layer;
wherein a ratio of a channel width W of the TFT connected to the light emitting element to the channel length L thereof is from 0.1 to 0.01.

In the respective configurations, the TFT connected to the light emitting element, in the range that the sum of source-drain voltage Vd and threshold voltage Vth is larger than gate voltage Vg, has a channel conductance gd from 0 to $1 \times 10^{-8}$ S, preferably of 0 to $5 \times 10^{-9}$ S, more preferably of 0 to $2 \times 10^{-9}$ S.

Still another configuration of the invention that is disclosed in the present specification is a light emitting device having a light emitting element, the light emitting element, including:
a cathode;
an organic compound layer in contact with the cathode; and
an anode in contact with the organic compound layer;
wherein the TFT connected to the light emitting element, in the range that the sum of source-drain voltage Vd and threshold voltage Vth is larger than gate voltage Vg, has a channel conductance gd from 0 to $2 \times 10^{-9}$ S.

In the respective configurations, the TFT connected to the light emitting element is a p-channel type TFT or an n-channel type TFT.

A region that is called a channel region in the present specification denotes a region that contains a portion (it is called also a channel) where carriers (electrons and holes) flow, and a length of the channel region in a direction in which the carriers flow is called a channel length and a width thereof a channel width.

Furthermore, in the specification, the channel conductance gd denotes a conductivity of a channel and can be expressed with the following equation.

$$gd = W(V_g - V_{th})\mu_n C_{ox}/L \qquad \text{[Equation 1]}$$

In the equation 1, L denotes a channel length, W a channel width, Vg a gate voltage, Vth a threshold voltage, µn mobility, and $C_{ox}$ an oxide film capacitance. In the TFT, when the Vg is equal to or more than the Vth, the channel conductance starts to generate.

In addition to this, in the case of the channel length L being made longer, the oxide film capacitance $C_{ox}$ becomes larger. Accordingly, the capacitance can be partially made use of as a retention capacitance of the OLED. So far, in order to form a retention capacitance, a space for forming the retention capacitance is necessary for each of pixels, and a capacitance line and a capacitance electrode are disposed. However, when a pixel configuration of the present invention is adopted, the capacitance line and the capacitance electrode can be omitted. Furthermore, in the case of the retention capacitance being formed with the oxide film capacitance Co, the retention capacitance can be formed, with a gate insulating film as dielectrics, of a gate electrode and a semiconductor (channel region) that overlaps with the gate electrode with the gate insulating film interposed therebetween. Accordingly, even in the case of the channel length of the TFT being made longer, as shown in FIG. 5, when a semiconductor layer 102 of the TFT is disposed below a power supply line 106 disposed at an upper layer of the gate electrode and a source wiring, a pixel can be designed without decreasing the open area ratio. That is, when the present pixel configuration is implemented, even when the space for the capacitance line and the capacitance electrode is omitted, sufficient retention capacitance can be provided, and furthermore the open area ratio can be improved.

In the combinations of the TFT sizes and the semiconductor layer shapes shown in FIGS. 18 and 19, the oxide film capacitances $C_{ox}$ are 192 (fF) for L×W=87 µm×7 µm (rectangular shape) case, 364.5 (fF) for L×W=165 µm×7 µm (rectangular shape) case, 111.1 (fF) for L×W=88 µm×4 µm (rectangular shape) case, 208.3 (fF) for L×W=165 µm×4 µm (rectangular shape) case, 631.3 (fF) for L×W=500 µm×4 µm (A type) case, and 631.3 (fF) for L×W=500 µm×4 µm (B type) case, respectively. Furthermore, other values when the oxide film capacitance $C_{ox}$ is obtained are set as follows. That is, a film thickness of the gate insulating film (oxide film) Tox is 115 nm, $\varepsilon_o$ is $8.8542 \times 10^{-12}$ (F/m²), and $\varepsilon_{ox}$ is 4.1.

Furthermore, in the respective configurations, the capacitance $C_{ox}$ of the TFT connected to the light emitting element is 100 fF or more, being preferably in the range of 100 fF to 700 fF.

Still furthermore, in the respective configurations, the gate electrode of the TFT connected to the light emitting element and a wiring disposed thereabove form a retention capacitance. Specifically, as shown in FIG. 5, with an interlayer insulating film (an organic insulating film or inorganic insulating film) disposed on the gate electrode 100 as dielectrics, the gate electrode 100 and a power supply line 106 that overlaps with the gate electrode 100 form a capacitance. In FIG. 5, an area with which the gate electrode 100 and the power supply line 106 overlap (12 µm×127 µm=about 1524 µm²) is large, though depending on the film thickness and dielectric constant of the interlayer insulating film, a retention capacitance is formed. All of the capacitance formed between the gate electrode 100 and the power supply line 106 is allowed to function as a retention capacitance of an EL element. Accordingly, it is preferable to appropriately design so that the sum of the capacitance $C_{ox}$ of the TFT that is connected to the light emitting element and the capacitance that is formed between the gate electrode of the TFT and the power supply line 106 may be several hundreds fF.

In the present specification, all layers formed between an anode and a cathode of the OLED are defined as an organic light emitting layers. The organic light emitting layers, specifically, comprises a light emitting layer, a hole injection layer, an electron injection layer, a hole transporting layer, and an electron transporting layer. Basically, the OLED has a structure in which an anode, a light emitting layer and a cathode are sequentially stacked. In addition to this structure, there are other structures in which an anode, a hole injection layer, a light emitting layer, and a cathode are sequentially stacked, or an anode, a hole injection layer, a light emitting layer, an electron transporting layer, and a cathode are sequentially stacked.

An OLED includes a layer that contains an organic compound (organic light emitting material) from which luminescence (Electro-luminescence) can be obtained when an electric field is applied (hereinafter, referred to as organic light emitting layer), an anode and a cathode. In the luminescence in the organic compound, there are luminescence generated when an excited singlet state relaxes to a ground state (fluorescence) and luminescence generated when an excited triplet state relaxes to the ground state (phosphorescence). In the light emitting device of the present invention, among the above luminescences, either one of the above luminescences may be used, or both of the luminescences may be used.

Furthermore, in the above, as an illustration, a top gate type TFT is explained. However, the present invention can be applied without restricting to a particular TFT structure. The present invention can be applied to, for instance, a bottom gate type (inverse stagger type) TFT and a forward stagger type TFT.

Still furthermore, in the light emitting device of the present invention, a driving method for displaying a screen is not restricted to a particular method. For instance, a dot sequential driving method, a line sequential driving method or a plane sequential driving method can be used. Typically, with the line sequential driving method, a time-sharing gradation driving method or an area gradation driving method may be appropriately applied. Furthermore, a video signal that is input to a source line of the light emitting device may be an analog signal or a digital signal, a driving circuit or the like being appropriately designed in accordance with a video signal.

DESCRIPTION OF THE PREFERRED EMBODIMENTS

In the following, modes for implementing the present invention will be explained.

Figure 5:
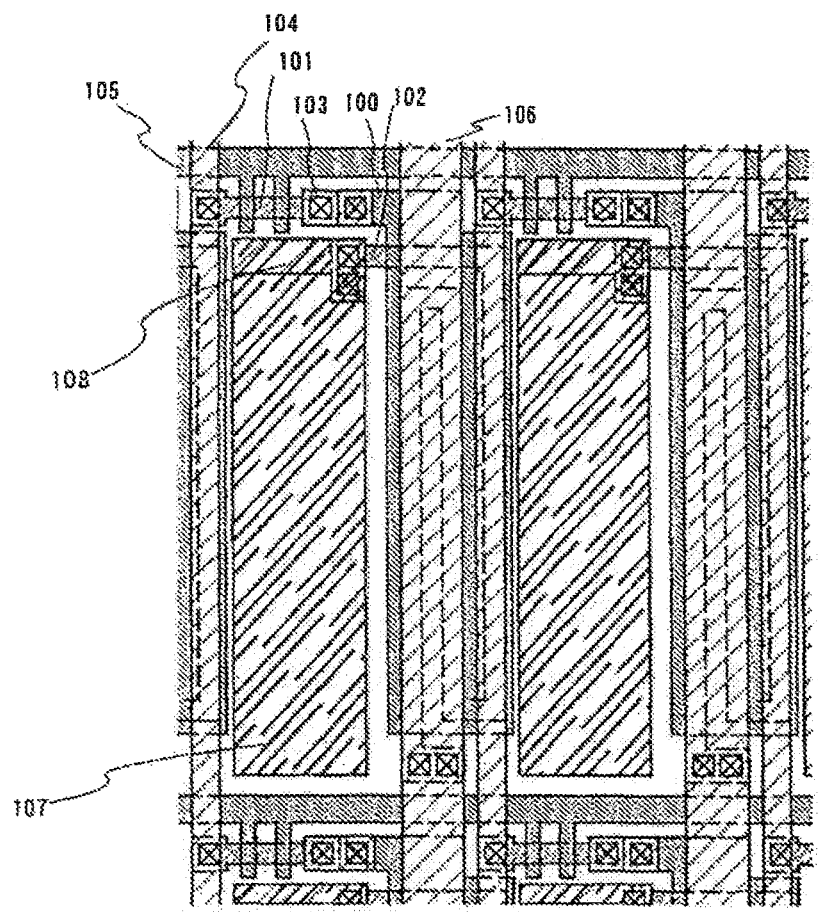
FIG. 5 is a diagram showing a top view of a pixel.

FIG. 5 is a partially enlarged top view of a pixel portion of a light emitting device having an OLED. In FIG. 5, for the sake of simplicity, an EL layer is not shown, and only one electrode (pixel electrode 107) of the OLED is shown.

In FIG. 5, a semiconductor layer 101 is a layer that works as an active layer of a switching TFT, a region that overlaps with a gate wiring 105 is a channel forming region, a region that connects with a source wiring 104 is a source region (or a drain region), and a region that connects with a connection electrode 103 is a drain region (or a source region). The switching TFT is a double-gate structure having two channel forming regions.

Furthermore, a semiconductor layer 102 is a layer that works as an active layer of a TFT that supplies a current to the OLED, a region that overlaps with a gate electrode 100 being a channel forming region. The gate electrode 100 of the TFT that supplies a current to the OLED is connected with the connection electrode 103. Still furthermore, a source region (or a drain region) of the TFT that supplies a current to the OLED and a power supply line 106 are connected, a drain region (or a source region) of the TFT that supplies a current to the OLED and a connection electrode 108 being connected, and a pixel electrode 107 being formed in contact with the connection electrode 108. Furthermore, above the gate electrode 100, the power supply line 106 and a source wiring of an adjacent pixel are disposed so as to partially overlap. Of the semiconductor layer 102, above a channel forming region that overlaps with the gate electrode 100 with the gate insulating film interposed therebetween, the power supply line 106 and a source wiring of an adjacent pixel are disposed so as to partially overlap. All of the capacitance formed between the gate electrode 100 and the power supply line 106 can be used as a retention capacitance of the EL element. Accordingly, with the capacitance formed between the gate electrode 100 and the power supply line 106, necessary retention capacitance can be secured to a certain degree.

Figure 6:
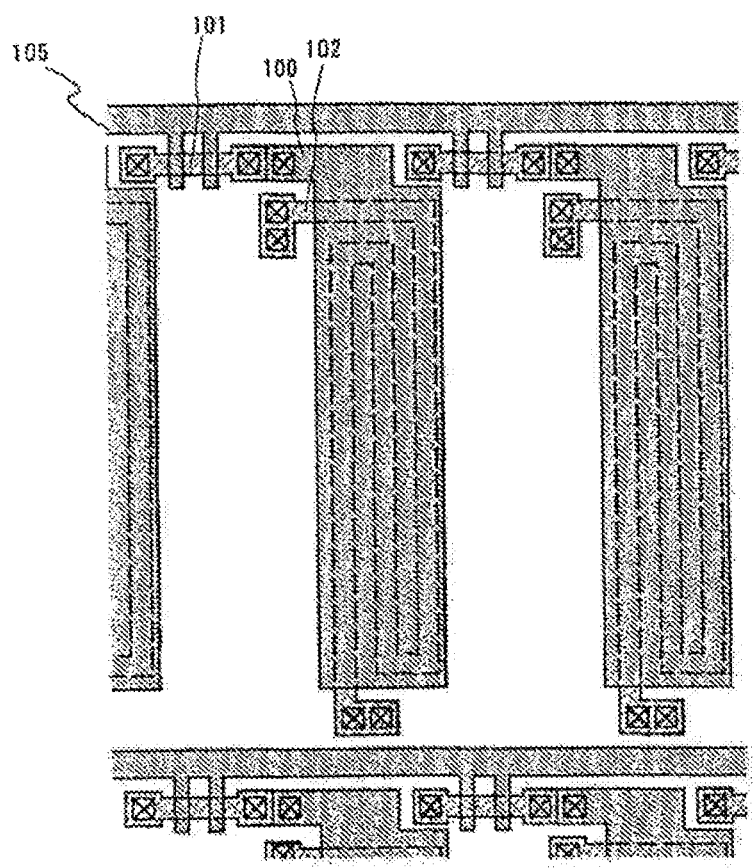
FIG. 6 is a diagram showing a top view of a pixel.

Furthermore, FIG. 6 is a top view corresponding to FIG. 5 and is a diagram at a stage where the semiconductor layers 101 and 102, the gate wiring 105 and the gate electrode 100 are formed. A region where the semiconductor layer 102 overlaps with the gate electrode 100 with a gate insulating film (not shown) interposed therebetween, that is, a channel forming region is shown with a dotted line in FIG. 6.

The present invention intends to provide a TFT that supplies a current to an OLED, and in the TFT, a length of a channel region (channel length L) is made particularly longer (L=100 to 500 m, in this case 500 μm is adopted), and thereby the TFT is allowed turning to an on-state at a gate voltage particularly higher than ever and driving, a channel conductance gd thereof being smaller (gd=0 to $1\times10^{-8}$ S, preferably $5\times10^{-9}$ S or less, and in this case $2\times10^{-9}$ S or less).

Figure 1:
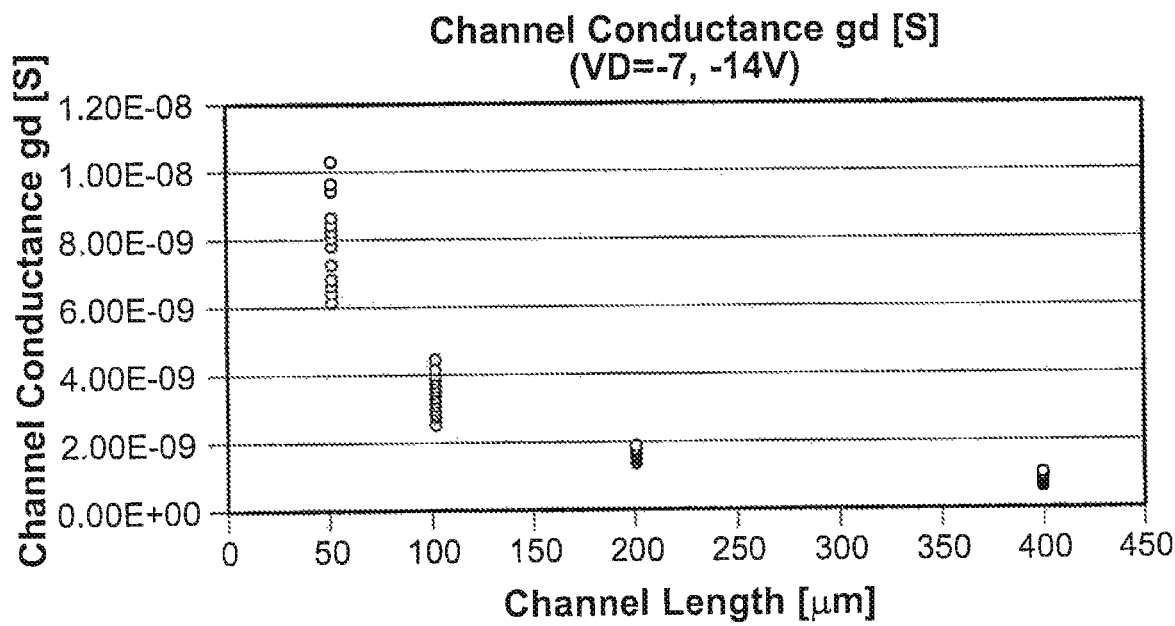
FIG. 1 is a diagram showing relationship between channel length of a TFT and channel conductance gd.
Figure 2:
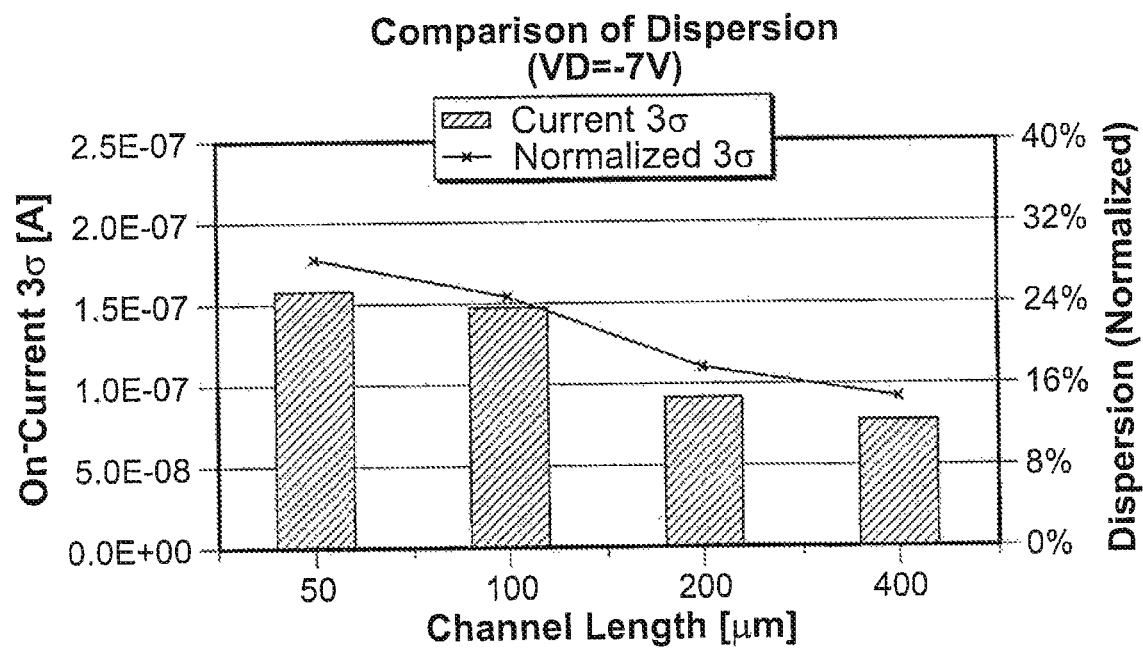
FIG. 2 is a diagram showing three sigma showing dispersion of current and three sigma showing normalized dispersion of current.
Figure 3:
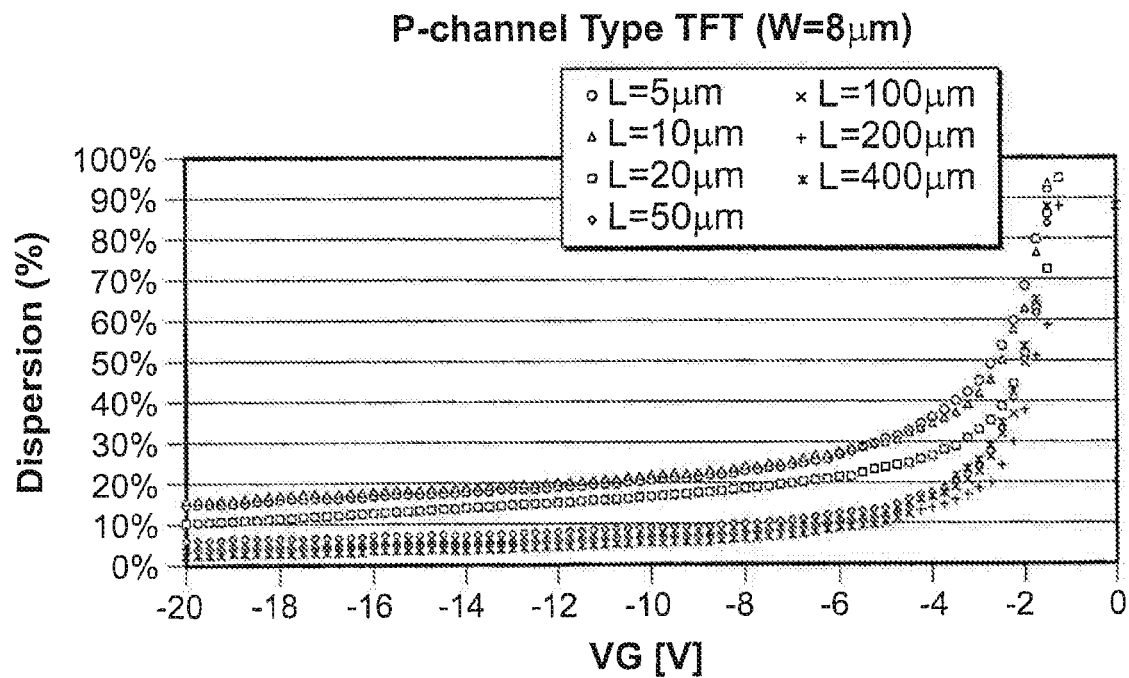
FIG. 3 is a diagram showing relationship between dispersion of current of p-channel type TFT and Vg at certain channel lengths.
Figure 4:
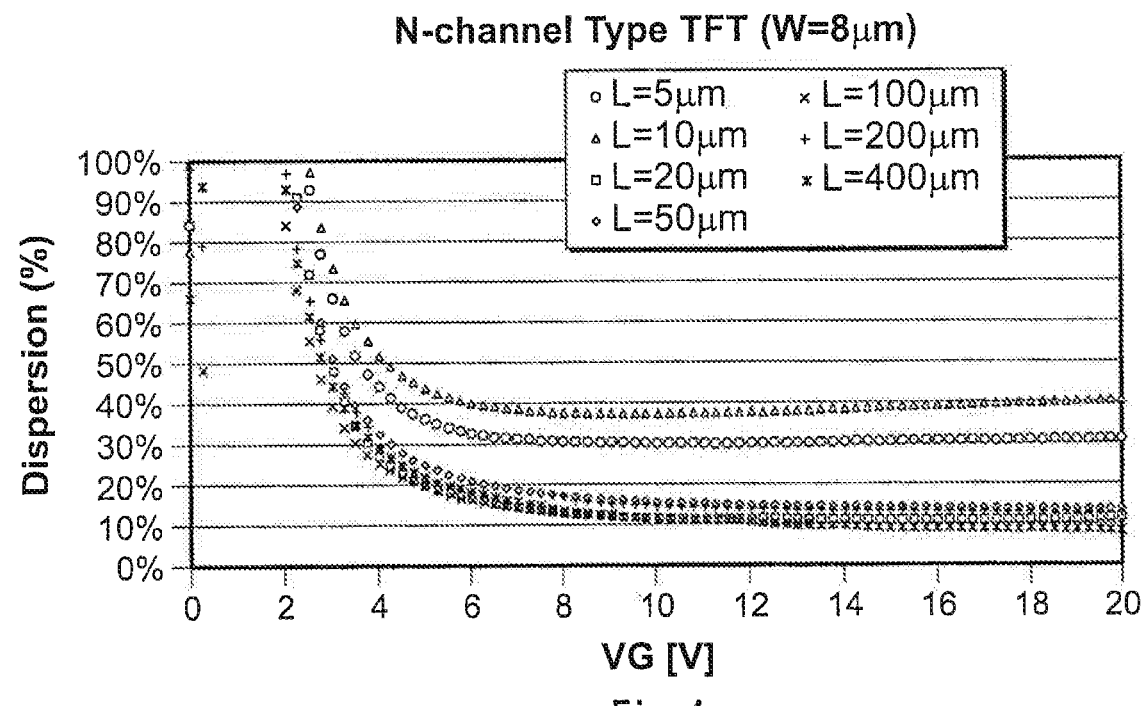
FIG. 4 is a diagram showing relationship between dispersion of current of n-channel type TFT and Vg at certain channel lengths.

By taking the above configuration, as shown in FIG. 2, in a pixel portion where a plurality of TFTs are arranged, in the TFTs that supply currents to the OLED, not only the simple dispersion of on-current but also the normalized dispersion thereof can be reduced, resulting in particularly reducing the dispersion of brightness of a display device having the OLED.

Figure 12:
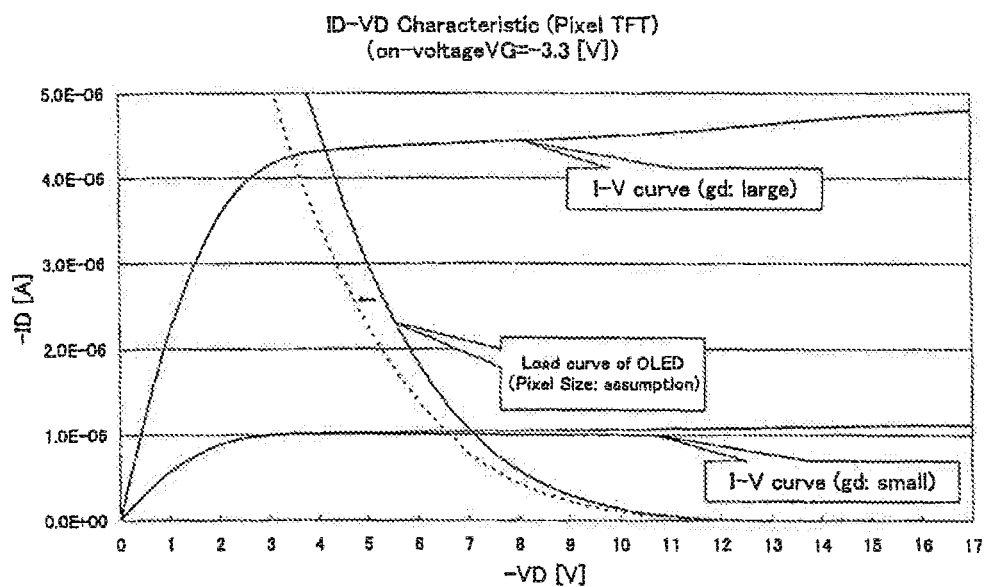
FIG. 12 is a diagram showing a load curve and an Id-Vd curve of the OLED.

Furthermore, when as a driving method of the OLED a method in which a current flowing to the OLED is controlled in a voltage range called a saturation region is adopted, the present invention exhibits an extremely conspicuous effect. When the configuration is adopted, as shown in FIG. 12, other than the reduction of the dispersion between the individual TFTs, also the dispersion caused at the preparation of the OLED (dispersion of the OLED itself caused by an area contraction of the EL layer at the patterning and heat treatment) can be reduced. Furthermore, by adopting the configuration, as shown in FIG. 12, other than the reduction of the dispersion between the individual TFTs, even when the OLED is deteriorated for some reason, the current flowing to the OLED can be maintained constant, resulting in maintaining a constant brightness.

Still furthermore, in the present invention, as a method of driving the OLED, a method that controls the current flowing to the OLED in a voltage region until the saturation region is attained is also useful.

It goes without saying that the present invention is not restricted to the top views shown in FIGS. 5 and 6. In FIGS. 5 and 6, a light emitting device that allows emitting light through a substrate over which the TFT is formed (the light emitting device shown in FIG. 14 is typical one) is illustrated. Accordingly, of the pixel electrode 107, an open area portion is a region where the connection electrode 108 is not formed, and in order to make the open area portion larger, a TFT whose channel length L is long is disposed below the power supply line 106 and the source wiring. All of capacitance formed between the gate electrode 100 of the TFT whose channel length L is long and the power supply line 106 can be used as the retention capacitance of the EL element. Furthermore, in the case of a light emitting device that emits light in a direction opposite to FIGS. 5 and 6 (a light emitting device shown in FIG. 15 is typical one), the open area portion becomes the same region as the pixel electrode. Accordingly, the TFT whose channel length L is long may be disposed below the pixel electrode, and a TFT having a further longer channel length L of 500 μm or more can be formed.

Furthermore, when the pixel structure shown in FIGS. 5 and 6 is adopted, without forming a capacitance portion for the formation of the retention capacitance, the oxide film capacitance $C_{ox}$ can be partially used as the retention capacitance. However, in one pixel, the retention capacitance and a memory (SRAM, DRAM or the like) may be formed. Still furthermore, in one pixel, a plurality of TFTs (two or more TFTs) and various circuits (current mirror circuit or the like) may be incorporated.

Furthermore, although in the above a top gate type TFT is illustrated, irrespective of the TFT structures, the present invention can be applied. The present invention can be applied to, for instance, a bottom gate type (inverse stagger type) TFT and a forward stagger type TFT.

The present invention thus configured will be detailed with reference to the following embodiments.

PREFERRED EMBODIMENTS

Embodiment 1

Here, a method of simultaneously manufacturing a pixel portion and TFTs (n-channel TFTs and a p-channel TFT) of a driving circuit provided in the periphery of the pixel portion over the same substrate to manufacture the light emitting device having OLED is described in detail.

For a lower layer of the base insulating film 301, a silicon oxynitride film formed from $SiH_4$, $NH_3$, and $N_2O$ as material gases (composition ratio: Si=32%, O=27%, N=24%, H=17%) is formed on the heat resistance glass substrate (the first substrate 300) having a thickness of 0.7 mm with a thickness of 50 nm (preferably 10 to 200 nm) and at a film deposition temperature of 400° C. by using plasma CVD. Then, after the surface is cleaned with ozone water, an oxide film on the surface is removed by means of dilute hydrofluoric acid (dilution with 1/100). Next, for an upper layer of a base insulating film 302, a silicon hydride oxynitride film formed from $SiH_4$ and $N_2O$ as material gases (composition ratio: Si=32%, O=59%, N=7%, H=2%) is formed thereon with a thickness of 100 nm (preferably 50 to 200 nm) and at a film deposition temperature of 400° C. by using plasma CVD to thereby form a lamination. Further, without exposure to an atmosphere, a semiconductor film having an amorphous structure (in this case, amorphous silicon film) is formed to have a thickness of 54 nm (preferably 25 to 80 nm) with $SiH_4$ as a film deposition gas and at a film deposition temperature of 300° C. by using plasma CVD.

In this embodiment, the base insulating film 104 is shown in a form of a two-layer structure, but a single layer of the insulating film or a structure in which two or more layers thereof are laminated may be adopted. Further, there is no limitation on the material of the semiconductor film. However, the semiconductor film may be preferably formed of silicon or silicon germanium ($Si_{1-X}Ge_X$ (X=0.0001 to 0.02)) alloy by using a known means (sputtering, LPCVD, plasma CVD, or the like). Further, a plasma CVD apparatus may be a single wafer type one or a batch type one. In addition, the base insulating film and the semiconductor film may be continuously formed in the same film formation chamber without exposure to an atmosphere.

Subsequently, after the surface of the semiconductor film having an amorphous structure is cleaned, an extremely thin oxide film with a thickness of about 2 nm is formed from ozone water on the surface. Then, in order to control a threshold value of a TFT, doping of a minute amount of impurity element (boron or phosphorous) is performed. Here, an ion doping method is used in which diborane ($B_2H_6$) is plasma-excited without mass-separation, and boron is added to the amorphous silicon film under the doping conditions: an acceleration voltage of 15 kV; a gas flow rate of diborane diluted to 1% with hydrogen of 30 sccm; and a dosage of $2\times10^{12}/cm^2$.

Then, a nickel acetate salt solution containing nickel of 10 ppm in weight is applied using a spinner. Instead of the application, a method of spraying nickel elements to the entire surface by sputtering may also be used.

Then, heat treatment is conducted to perform crystallization, thereby forming a semiconductor film having a crystalline structure. A heating process using an electric furnace or irradiation of strong light may be conducted for this heat treatment. In case of the heating process using an electric furnace, it may be conducted at 500 to 650° C. for 4 to 24 hours. Here, after the heating process (500° C. for 1 hour) for dehydrogenation is conducted, the heating process (550° C. for 4 hours) for crystallization is conducted, thereby obtaining a silicon film having a crystalline structure. Note that, although crystallization is performed by using the heating process using a furnace, crystallization may be performed by means of a lamp annealing apparatus. Also note that, although a crystallization technique using nickel as a metal element that promotes crystallization of silicon is used here, other known crystallization techniques, for example, a solid-phase growth method and a laser crystallization method, may be used.

Next, after the oxide film on the surface of the silicon film having a crystalline structure is removed by dilute hydrofluoric acid or the like, irradiation of first laser light (XeCl: wavelength of 308 nm) for raising a crystallization rate and repairing defects remaining in crystal grains is performed in an atmosphere or in an oxygen atmosphere. Excimer laser light with a wavelength of 400 nm or less, or second harmonic wave or third harmonic wave of a YAG laser is used for the laser light. In any case, pulse laser light with a repetition frequency of approximately 10 to 1000 Hz is used, the pulse laser light is condensed to 100 to 500 mJ/cm$^2$ by an optical system, and irradiation is performed with an overlap ratio of 90 to 95%, whereby the silicon film surface may be scanned. Here, the irradiation of the first laser light is performed in an atmosphere with a repetition frequency of 30 Hz and energy density of 470 mJ/cm$^2$. Note that an oxide film is formed on the surface by the first laser light irradiation since the irradiation is conducted in an atmosphere or in an oxygen atmosphere. Though an example of using the pulse laser is shown here, the continuous oscillation laser may also be used. When a crystallization of an amorphous semiconductor film is conducted, it is preferable that the second harmonic through the fourth harmonic of basic waves is applied by using the solid state laser which is capable of continuous oscillation in order to obtain a crystal in large grain size. Typically, it is preferable that the second harmonic (with a thickness of 532 nm) or the third harmonic (with a thickness of 355 nm) of an Nd: YVO$_4$ laser (basic wave of 1064 nm) is applied. Specifically, laser beams emitted from the continuous oscillation type YVO$_4$ laser with 10 W output is converted into a harmonic by using the non-linear optical elements. Also, a method of emitting a harmonic by applying crystal of YVO$_4$ and the non-linear optical elements into a resonator. Then, more preferably, the laser beams are formed so as to have a rectangular shape or an elliptical shape by an optical system, thereby irradiating a substance to be treated. At this time, the energy density of approximately 0.01 to 100 MW/cm$^2$ (preferably 01. to 10 MW/cm$^2$) is required. The semiconductor film is moved at approximately 10 to 2000 cm/s rate relatively corresponding to the laser beams so as to irradiate the semiconductor film.

Though the technique of irradiating laser light is conducted after heat treatment using nickel as a metal element for promoting the crystallization is performed here, crystallization of an amorphous silicon film may be performed by using continuous oscillation layer (the second harmonics of YVO$_4$ laser) without doping nickel.

The oxide film formed by this laser light irradiation and an oxide film formed by treating the surface with ozone water for 120 seconds together make a barrier layer that has a thickness of 1 to 5 nm in total. Though the barrier layer is formed by using ozone water here, another method such as ultraviolet light irradiation performing in an oxygen atmosphere or oxide plasma treatment to oxidize the surface of the semiconductor film having the crystalline structure may be used. In addition, as another method for forming the barrier layer, an oxide film having a thickness of about 1 nm to 10 nm may be deposited by a plasma CVD method, a sputtering method, an evaporation method, or the like. In this specification, the term barrier layer refers to a layer which has a film quality or film thickness that allows a metal element to pass in the gettering step and which functions as an etching stopper in the step of removing the layer that functions as a gettering site.

On the barrier layer, an amorphous silicon film containing argon elements are formed to a thickness of 50 to 400 nm, in this embodiment, 150 nm by sputtering to serve as a gettering site. Film formation conditions by sputtering in this embodiment include setting the film formation pressure to 0.3 Pa, the gas (Ar) flow rate to 50 sccm, the film formation power to 3 kW, and the substrate temperature to 150° C. The amorphous silicon film that is formed under the above conditions contains argon elements in an atomic concentration of $3\times10^{20}$ to $6\times10^{20}/cm^3$, and contains oxygen in an atomic concentration of $1\times10^{19}$ to $3\times10^{19}/cm^3$. Thereafter, an electric furnace is used in heat treatment at 550° C. for 4 hours for gettering to reduce the nickel concentration in the semiconductor film having a crystalline structure. The lamp annealing apparatus may by used instead of the electric furnace.

Subsequently, the amorphous silicon film containing the argon element, which is the gettering site, is selectively removed with the barrier layer as an etching stopper, and then, the barrier layer is selectively removed by dilute hydrofluoric acid. Note that there is a tendency that nickel is likely to move to a region with a high oxygen concentration in gettering, and thus, it is desirable that the barrier layer comprised of the oxide film is removed after gettering.

Then, after a thin oxide film is formed from ozone water on the surface of the obtained silicon film having a crystalline structure (also referred to as polysilicon film), a mask made of resist is formed, and an etching process is conducted thereto to obtain a desired shape, thereby forming the island-like semiconductor layers separated from one another. After the formation of the semiconductor layers, the mask made of resist is removed.

Then, the oxide film is removed with the etchant containing hydrofluoric acid, and at the same time, the surface of the silicon film is cleaned. Thereafter, an insulating film containing silicon as its main constituent, which becomes a gate insulating film 303, is formed. In this embodiment, a silicon oxynitride film (composition ratio: Si=32%, O=59%, N=7%, H=2%) is formed with a thickness of 115 nm by plasma CVD.

Next, on the gate insulating film 303, a first conductive film with a thickness of 20 to 100 nm and a second conductive film with a thickness of 100 to 400 nm are formed in lamination. In this embodiment, a 50 nm thick tantalum nitride film and a 370 nm thick tungsten film are sequentially laminated on the gate insulating film 303.

As a conductive material for forming the first conductive film and the second conductive film, an element selected from the group consisting of Ta, W, Ti, Mo, Al and Cu, or an alloy material or compound material containing the above element as its main constituent is employed. Further, a semiconductor film typified by a polycrystalline silicon film doped with an impurity element such as phosphorous, or an AgPdCu alloy may be used as the first conductive film and the second conductive film. Further, the present invention is not limited to a two-layer structure. For example, a three-layer structure may be adopted in which a 50 nm thick tungsten film, an alloy film of aluminum and silicon (Al—Si) with a thickness of 500 am, and a 30 am thick titanium nitride film are sequentially laminated. Moreover, in case of a three-layer structure, tungsten nitride may be used in place of tungsten of the first conductive film, an alloy film of aluminum and titanium (Al—Ti) may be used in place of the alloy film of aluminum and silicon (Al—Si) of the second conductive film, and a titanium film may be used in place of the titanium nitride film of the third conductive film. In addition, a single layer structure may also be adopted.

An ICP (inductively coupled plasma) etching method may be preferably used for the etching process of the above-mentioned first and second conductive films (the first and second etching processes). The ICP etching method is used, and the etching conditions (an electric energy applied to a coil-shape electrode, an electric energy applied to an electrode on a substrate side, a temperature of the electrode on the substrate side, and the like) are appropriately adjusted, whereby a film can be etched to have a desired taper shape. In this embodiment, after the resist mask is formed, RF (13.56 MHz) power of 700 W is applied to the coil-shape electrode with a pressure of 1 Pa as a first etching condition, and $CF_4$, $SF_6$, and $NF_3$, and $O_2$ can be appropriately used as etching gases. Each flow rate of gasses is set to 25/25/10 (sccm), and RF (13.56 MHz) power of 150 W is applied also to the substrate (sample stage) to substantially apply a negative self-bias voltage. Note that, size of the electrode area on the substrate side is 12.5 cm×12.5 cm, and coil-shape electrode (a quartz disc comprising a coil is used here) has 25 cm in diameter. With the first etching conditions, a W film is etched to form an end portion of the first conductive layer into a tapered shape. Thereafter, the resist mask is removed and the second etching condition is adopted. $CF_4$ and $Cl_2$ are used as etching gases, the flow rate of the gases is set to 30/30 sccm, and RF (13.56 MHz) power of 500 W is applied to a coil-shape electrode with a pressure of 1 Pa to generate plasma, thereby performing etching for about 30 seconds. RF (13.56 MHz) power of 20 W is also applied to the substrate side (sample stage) to substantially apply a negative self-bias voltage. Under the second etching conditions in which $CF_4$ and $Cl_2$ are mixed, both the W film and the TaN film are etched at the same level. Here, the first etching condition and the second etching condition are referred to as the first etching treatment.

The second etching treatment is performed without removing a resist mask. Here, $CF_4$ and $Cl_2$ are used as etching gases, the flow rate of the gases is set to 30/30 sccm, and RF (13.56 MHz) power of 500 W is applied to a coil-shape electrode with a pressure of 1 Pa to generate plasma, thereby performing etching for about 60 seconds. RF (13.56 MHz) power of 20 W is also applied to the substrate side (sample stage) to substantially apply a negative self-bias voltage. Thereafter, the fourth etching treatment is performed without removing a resist mask, $CF_4$, $Cl_2$, and $O_2$ are used as etching gases, the flow rate of the gases is set to 20/20/20 sccm, and RF (13.56 MHz) power of 500 W is applied to a coil-shape electrode with a pressure of 1 Pa to generate plasma, thereby performing etching for about 20 seconds. RF (13.56 MHz) power of 20 W is also applied to the substrate side (sample stage) to substantially apply a negative self-bias voltage. Here, the third etching condition and the fourth etching condition are referred to as the second etching treatment. At this stage, the gate electrode and electrodes 304 and 305 to 307 comprised of the first conductive layer 304a as a lower layer and the second conductive layer 304b as a upper layer are formed. At this state, the upper structure of pixels may be formed as shown in FIG. 6.

After removing the resist masks, the first doping treatment is conducted to dope using gate electrodes 304 to 307 as masks to entire surface. The first doping treatment employs ion doping or ion implantation. In ion doping, the dose is set to $1.5 \times 10^{14}$ atoms/cm$^2$ and the acceleration voltage is set to 60 to 100 keV. Typically, phosphorus (P) or arsenic (As) is used as an impurity element that gives the n-type conductivity. The first impurity regions (n$^-$ region) 322 to 325 are formed in a self aligning manner.

Subsequently, new resist masks are formed. The masks are formed to cover the channel formation region or the portion of the semiconductor layer for forming the switching TFT 403 of the pixel portion 401. The masks are formed to protect the channel formation region or the portion of the semiconductor layer for forming the p-channel TFT 406 of the driving circuit. In addition, masks are formed to cover the channel formation region of the semiconductor layer for forming the current control TFT 404 of the pixel portion 401 or the periphery portion thereof.

Next, the impurity region (n$^-$ region) overlapping with a part of the gate electrode by performing selectively the second doping treatment using resist masks. The second doping processing may be performed by the ion-doping method or the ion-implanting method. In this embodiment, the ion doping method is performed under a condition in a gas flow rate of phosphine ($PH_3$) diluted to 5% with hydrogen of 30 sccm, and the dose of $1.5 \times 10^{13}$ atoms/cm$^2$ and the accelerating voltage of 90 kV. The resist mask and the second conductive film function as mask for the n-type doping impurity element, and the second impurity regions 311 and 312 are formed. An n-type doping impurity element in the density range of $1 \times 10^{16}$ to $1 \times 10^{17}$ atoms/cm$^3$ are added to the impurity regions 311 and 312. In this embodiment, the region of same concentration range as the second impurity region is referred to as n region.

The third doping processing is performed without removing masks made of resist. The third doping processing may be performed by the ion-doping method or the ion-implanting method. As the n-type doping impurity element may be typically used phosphorus (P) or arsenic (As). In this embodiment, the ion doping method is performed under a condition in a gas flow rate of phosphine ($PH_3$) diluted to 5% with hydrogen of 40 sccm, the dose of $2\times10^{13}$ atoms/cm², and the accelerating voltage of 80 kV. In this case, the resist mask, the first conductive layer, and the second conductive layer function as masks for the n-type doping impurity element and the third impurity regions 313, 314, and 326 to 328 are formed. An n-type doping impurity element in the density range of $1\times10$ to $1\times10^{21}$ atoms/cm³ are added to the third impurity regions 313 and 314. In this embodiment, the region of same density range as the third impurity region is referred to as n⁺ region.

After the resist mask is removed, the mask made from resist is formed to perform the fourth doping treatment. By the fourth doping treatment, the fourth impurity regions 318, 319, 332, and 333 and the fifth impurity regions 316, 317, 330, and 331 are formed that is the semiconductor layer forming the semiconductor layer forming the p-channel type TFT in which p-type doping impurity element is added.

A p-type doping impurity element in the density range of $1\times10^{20}$ to $1\times10^{21}$ atoms/cm³ are added to the fourth impurity regions 318, 319, 332, and 333. Note that, in the fourth impurity regions 318, 319, 332, and 333, phosphorous (P) has been added in the preceding step (n⁻ region), but the p-type doping impurity element is added at a density that is 1.5 to 3 times as high as that of phosphorous. Thus, the fourth impurity regions 318, 319, 332, and 333 have a p-type conductivity. In this embodiment, the region of same density range as the fourth impurity region is referred to as p⁺ region.

The fifth impurity regions 316, 317, 330, and 331 are formed to overlap with the taper portion of the second conductive layer, and added with the p-type impurity element in the density range of $1\times10^{1s}$ to $1\times10^{20}$ atoms/cm³. In this embodiment, the region of same density range as the fifth impurity region is referred to as p⁻ region.

Though the above-described steps, the impurity regions having n-type or p-type doping impurity element are formed in the respective semiconductor layer. The conductive layers 304 to 307 become gate electrodes of TFT.

Next, an insulating film (not shown) that covers substantially the entire surface is formed. In this embodiment, a 50 nm thick silicon oxide film is formed by plasma CVD. Of course, the insulating film is not limited to a silicon oxide film, and other insulating films containing silicon may be used in a single layer or a lamination structure.

Then, a step of activating the impurity element added to the respective semiconductor layers is conducted. In this activation step, a rapid thermal annealing (RTA) method using a lamp light source, a method of irradiating light emitted from a YAG laser or excimer laser from the back surface, heat treatment using a furnace, or a combination thereof is employed.

Further, although an example in which the insulating film is formed before the activation is shown in this embodiment, a step of forming the insulating film may be conducted after the activation is conducted.

Next, a first interlayer insulating film 308 is formed of a silicon nitride film, and heat treatment (300 to 550° C. for 1 to 12 hours) is performed, thereby conducting a step of hydrogenating the semiconductor layers. This step is a step of terminating dangling bonds of the semiconductor layers by hydrogen contained in the first interlayer insulating film 308. The semiconductor layers can be hydrogenated irrespective of the existence of an insulating film (not shown) formed of a silicon oxide film. As another means for hydrogenation, plasma hydrogenation (using hydrogen excited by plasma) may be conducted.

Next, a second interlayer insulating film 309 is formed from an organic insulating material on the first interlayer insulating film 308. In this embodiment, an acrylic resin film 309a with a thickness of 1.6 μm is formed by a coating method. Further, the silicon nitride film 309b with a thickness of 200 nm is formed by using a sputtering method. In this embodiment, an example of depositing the silicon nitride film on the acrylic resin film with a thickness of 1.6 μm is shown. The material or the thickness of the insulating film are not limited. In the case that a capacity is formed between the gate electrode and the power source current line that is formed on the gate electrode, the thickness of the organic insulating film and the inorganic insulating film may be 0.5 μm to 2.0 μm.

Next, the pixel electrode 334 is formed that contacts to the drain region of the current control TFT 404 including p-channel TFT to contact and overlap with the connection electrode to be formed later. In this embodiment, the pixel electrode functions as an anode of OLED, and is a transparent conductive film to pass the light from OLED to the pixel electrode.

The contact hole that reaches the conductive layer to be the gate electrode or the gate wiring, and the contact hole that reach each impurity region. In this embodiment, the plural etching treatments are performed sequentially. In this embodiment, the third interlayer insulating film is etched using the second interlayer insulating film as an etching stopper, and the first interlayer insulating film is etched after the second interlayer insulating film is etched using the first interlayer insulating film as the etching stopper.

Thereafter, the electrodes 335 to 341 are formed by using Al, Ti, Mo, W and the like. Specifically, a source wiring, a power source supply line, an extraction electrode, and a connection electrode are formed. As the material of the electrodes and the wirings, a lamination film having Al film (350 nm thickness) including Ti film (110 nm thickness) and silicon, and Ti film (50 nm thickness) is used. And patterning is performed. Thus, the source electrode, the source wiring, the connection electrode, the extraction electrode, and the power source supply line are formed appropriately. Further, the extraction electrode for contacting with the gate wiring overlapped with the interlayer insulating film is provided in the edge portion of the gate wiring. The input-output terminal portion in which the plural electrodes for connecting with an external circuit and an external power source is provided are formed in other edge portions of each wiring. The connection electrode 341 to contact and overlap with the pixel electrode 334 that is formed previously contacts with the drain region of the current control TFT 404.

As described above, a driving circuit 402 having an n-channel TFT 405, a p-channel TFT 406, and a CMOS circuit that combines complementary the n-channel TFT 405 and a p-channel TFT 406, and a pixel portion 401 provided the plural n-channel TFTs 403 or the plural p-channel TFTs 404 in one pixel are formed.

In this embodiment, the length of the channel formation region 329 of the p-channel TFT 404 connecting to OLED 400 is quite long. For example, the top surface structure may be formed as shown in FIG. 5. The length of channel L is 500 μm in FIG. 5. The width of channel W is 4 μm.

The patterning of each electrode is completed, the heat treatment is conducted removing resist. The insulators 342a, 342b referred to as bank are formed to overlap with the edge portion of the pixel electrode 334. The bank 342a and 342b may be formed by using an insulating film containing silicon or resin film. Here, after the bank 342a is formed by patterning the insulating film made from an organic resin film and the silicon nitride film is formed by the sputtering method. And the bank 342b is formed by performing patterning.

Next, an EL layer 343 is formed on the pixel electrode 334 whose ends are covered with the banks and a cathode 344 of an OLED is formed thereon.

An EL layer 343 (a layer for light emission and for moving of carriers to cause light emission) has a light emitting layer and a free combination of electric charge transporting layers and electric charge injection layers. For example, a low molecular weight organic EL material or a high molecular weight organic EL material is used to form an EL layer. An EL layer may be a thin film formed of a light emitting material that emits light by singlet excitation (fluorescence) (a singlet compound) or a thin film formed of a light emitting material that emits light by triplet excitation (phosphorescence) (a triplet compound). Inorganic materials such as silicon carbide may be used for the electric charge transporting layers and electric charge injection layers. Known organic EL materials and inorganic materials can be employed.

It is said that the preferred material of a cathode 344 is a metal having a small work function (typically, a metal element belonging to Group 1 or 2 in the periodic table) or an alloy of such metal. The light emission efficiency is improved as the work function becomes smaller. Therefore, an alloy material containing Li (lithium) that is one of alkali metals is particularly desirable as the cathode material. The cathode also functions as a wiring common to all pixels and has a terminal electrode in an input terminal portion through a connection wiring.

Figure 7:
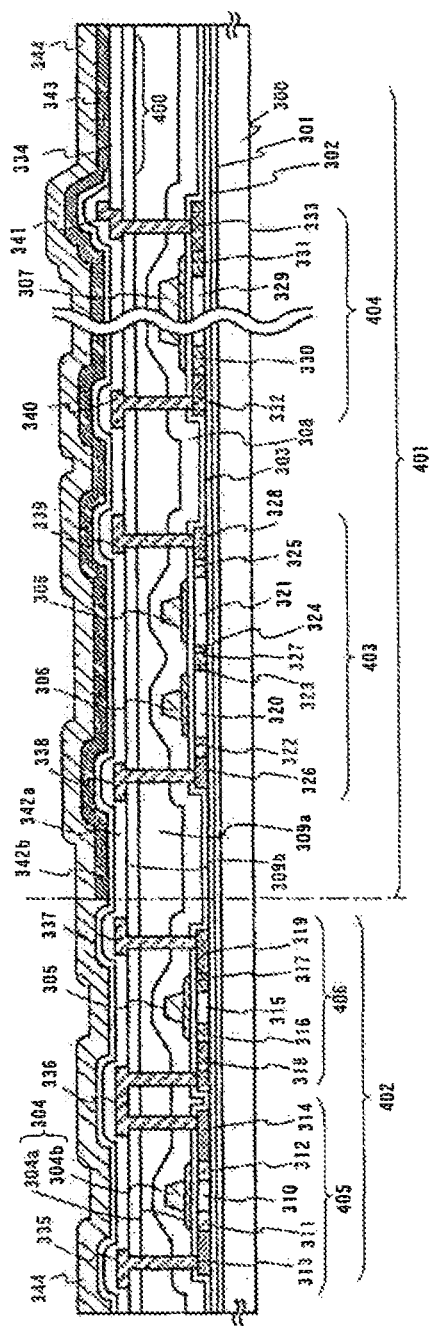
FIG. 7 is a diagram showing a sectional structure of an active matrix type light emitting display device.

FIG. 7 is a state that is completed so far.

Next, the OLED having at least a cathode, an organic compound layer, and an anode is preferably sealed by an organic resin, a protective film, a sealing substrate, or a sealing can to cut the OLED completely off from the outside and prevent permeation of external substances, such as moisture and oxygen, that accelerate degradation due to oxidization of the EL layer. However, it is not necessary to provide the protective film or the like in the input-output terminal portions to which an FPC needs to be connected later.

The FPC (flexible printed circuit) is attached to the electrodes of the input-output terminal portions using an anisotropic conductive material. The anisotropic conductive material is composed of a resin and conductive particles several tens to several hundreds μm in diameter whose surfaces are plated by Au or the like. The conductive particles electrically connect the electrodes of the input-output terminal portions with wirings formed in the FPC.

If necessary, an optical film such as a circularly polarizing plate composed of a polarizing plate and a phase difference plate may be provided and an IC chip may be mounted.

According above the steps, the module type light emitting device connected FPC is completed.

Figure 8:
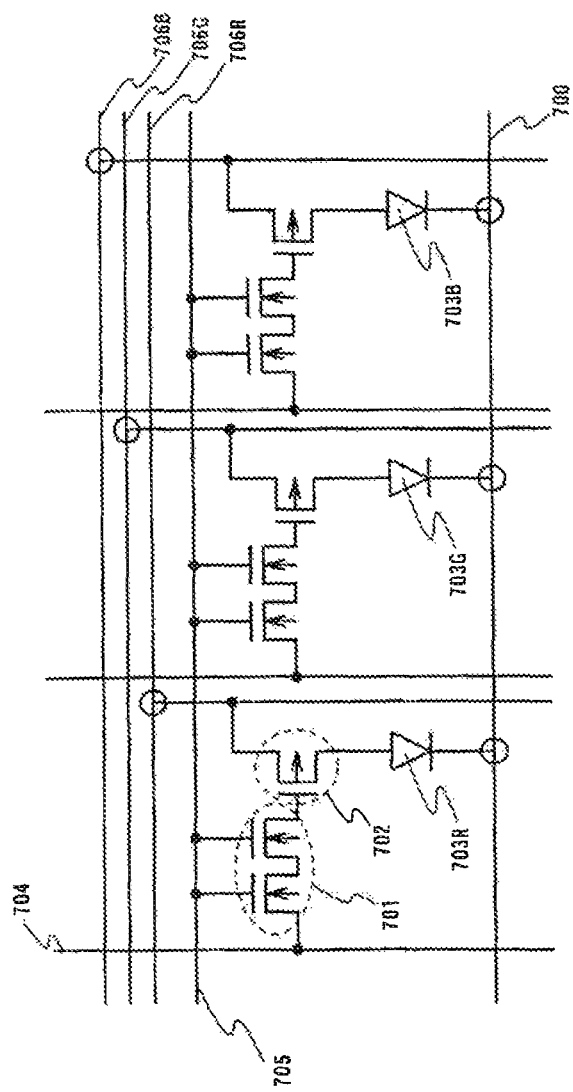
FIG. 8 is a diagram showing an equivalent circuit of an active matrix type light emitting display device.
Figure 9:
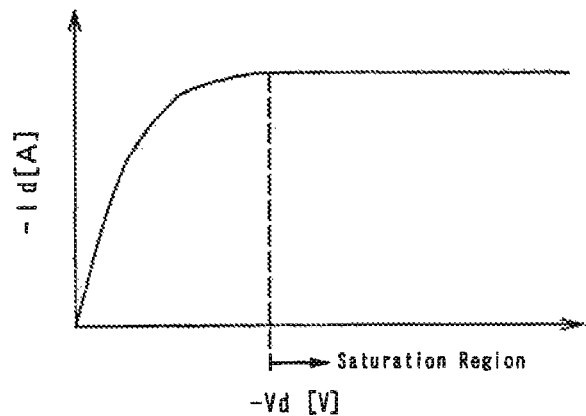
FIG. 9 is a diagram showing a graph showing an Id-Vd curve.
Figure 10A:
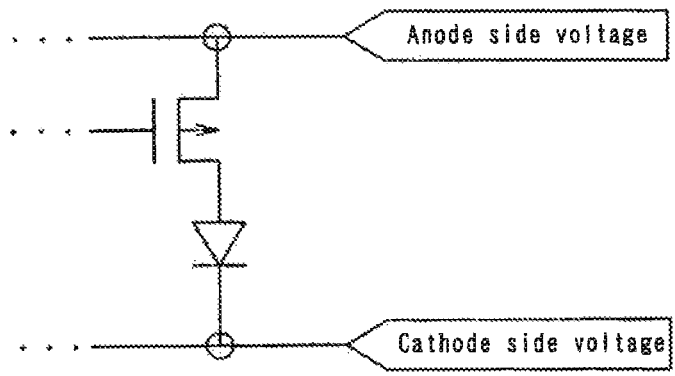
FIGS. 10A and 10B are diagrams showing connection relations between an OLED and a TFT connected to the OLED.
Figure 10B:
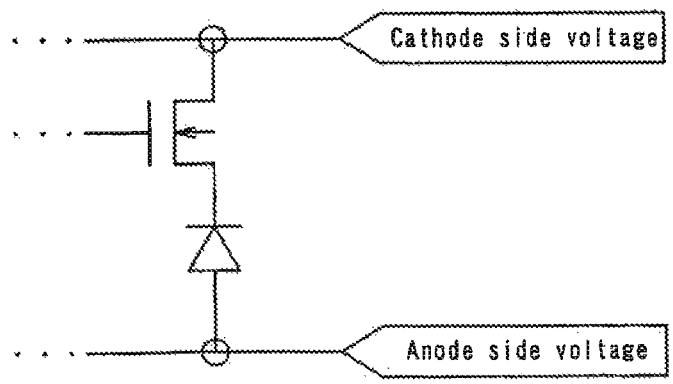
Figure 11:
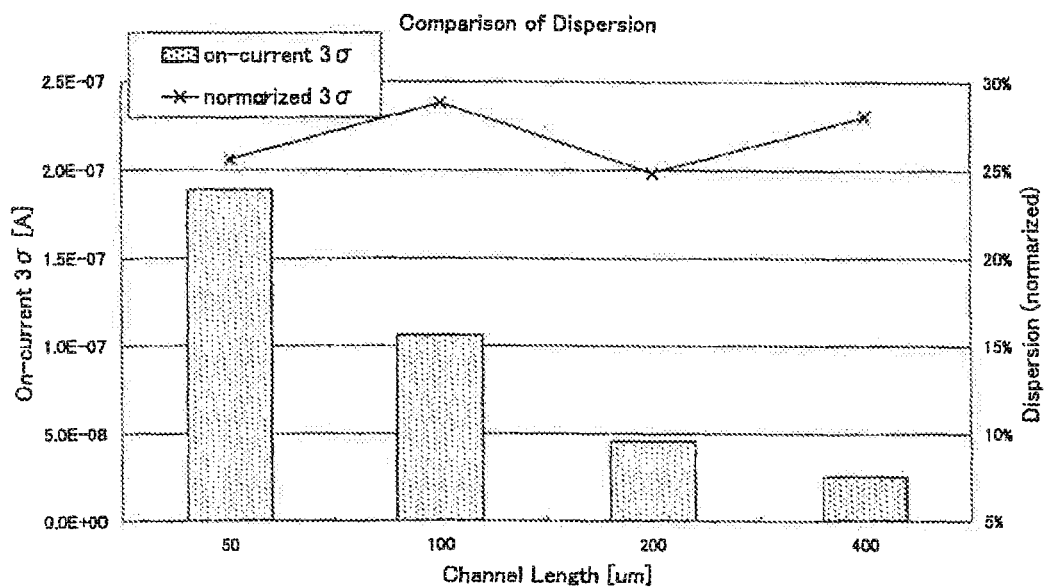
FIG. 11 is a diagram showing three sigma showing the dispersion of current and three sigma showing the normalized dispersion of current.

Moreover, when displaying by full color, the equivalent circuit diagram in the pixel portion of this embodiment is shown in FIG. 8. A reference numeral 701 in FIG. 8 corresponds to the switching TFT 403 of FIG. 7, and a reference numeral 702 corresponds to a current control TFT 404. The pixel to which OLED 703R which displays red light to the drain region of the current control TFT 404 is connected, and anode side power supply line R 706R is prepared in the source region. Moreover, the cathode side power supply line 700 is formed in OLED 703R. Moreover the pixel to which OLED 703G which displays green light to the drain region of the current control TFT are connected, and an anode side power supply line G 706 G are prepared in the source region. Moreover, the pixel to which OLED 703B which displays blue light to the drain region of the current control TFT is connected, and anode side power supply line B 706B is prepared in the source region. Different voltage is impressed to each pixel that has different colors according to EL material, respectively. In order to reduce the channel conductance gd, the channel length is made longer, and made to drive as an ON state with a high gate voltage rather than conventional cases.

In this embodiment, as a display driving method, time division gray scale driving method that is a kind of line sequential driving method. For inputting an image signal to the source wiring, the both analog signal and digital signal may be used. The driving circuit and the like may be appropriately designed according to the image signal.

Embodiment 2

Figure 13A:
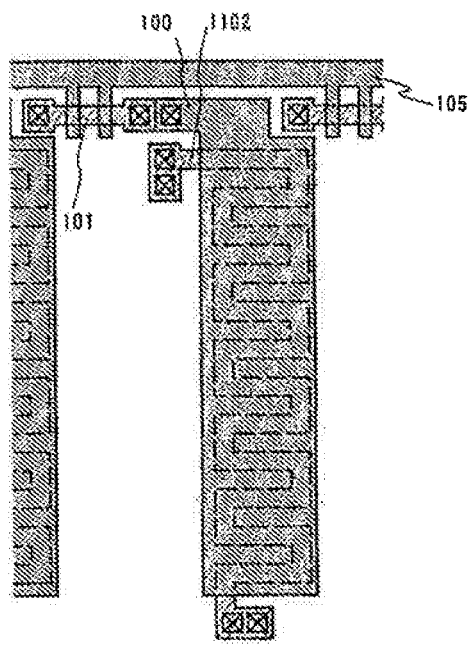
FIGS. 13A and 13B are diagrams showing top views of pixels (Embodiment 2).
Figure 13B:
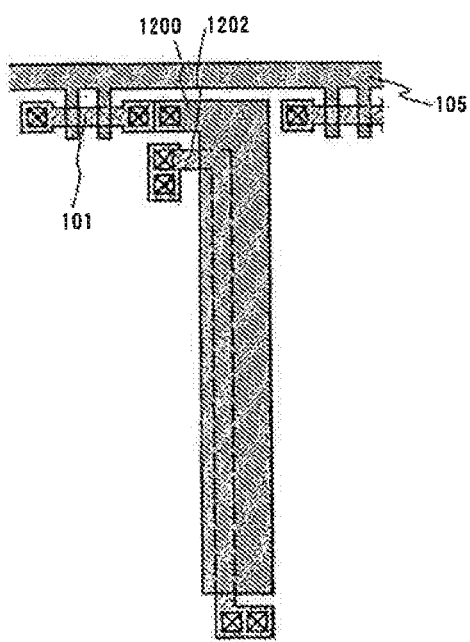

This embodiment shows a top view (FIGS. 5 and 6) that is enlarged a part of the pixel portion in Embodiment 1, and a top view that is different in a part from FIGS. 5 and 6 is shown in FIGS. 13A and 13B.

FIG. 13A is a corresponding top view to FIG. 6, and same portions thereof are indicated by same symbols. FIG. 13A is an example of semiconductor layer 1102 that has different patterning shape that is adopted instead of the semiconductor layer 102 shown in FIG. 6. In this embodiment, the semiconductor layer 1102 is meandering. As shown in FIG. 13A, channel length L x channel width W is the same as FIG. 6, and is set 500 μm×4 μm. FIG. 13A is same as Embodiment 1 except the semiconductor layer 1102 that has a different patterning shape, so that another explanation may be referenced to Embodiment 1.

FIG. 13B shows another different top view. Same portion corresponding to FIG. 6 are indicated by same symbols. FIG. 13B shows a semiconductor layer 1202 that has different patterning shape that is adopted instead of the semiconductor layer 102 shown in FIG. 6, and an electrode 1200 that is adopted instead of the electrode 100. The channel length in FIG. 13B is 165 μm. FIG. 13B is same as Embodiment 1 except the semiconductor layer 1202 and the electrode 1200 that has a different patterning shape, so that another explanation may be referenced to Embodiment 1.

This embodiment can be combined with Embodiment Mode or Embodiment 1.

Embodiment 3

The top view and cross-sectional view of the module type light emitting device (also referred to as EL module) obtained by Embodiment 1 or 2 are illustrated.

Figure 14A:
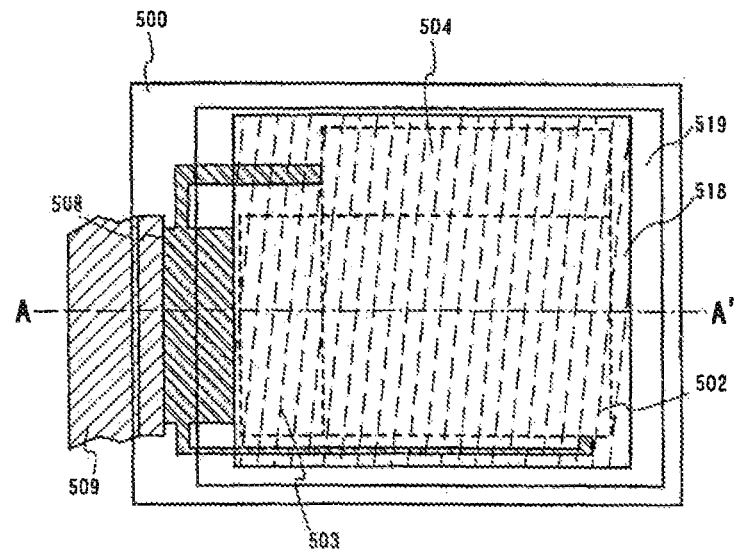
FIGS. 14A and 14B are diagrams showing a module (Embodiment 3).
Figure 14B:
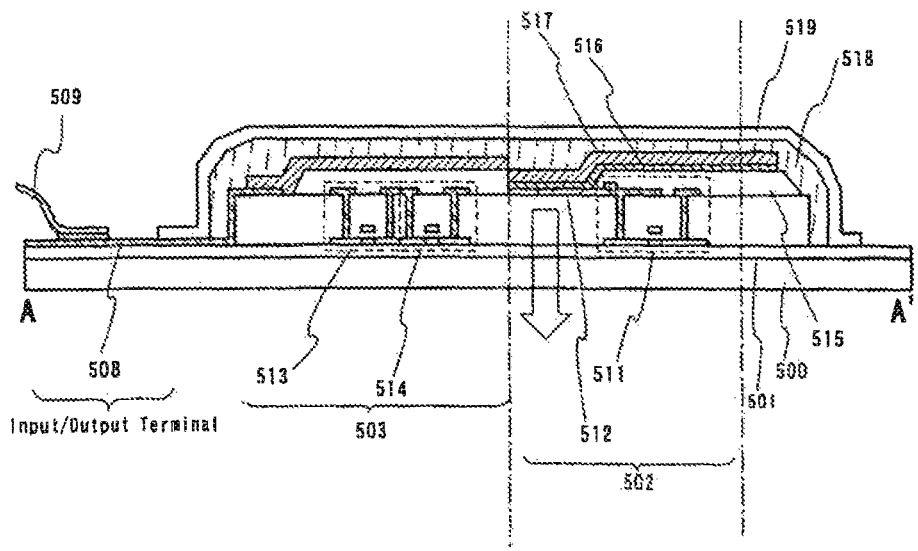
Figure 15:
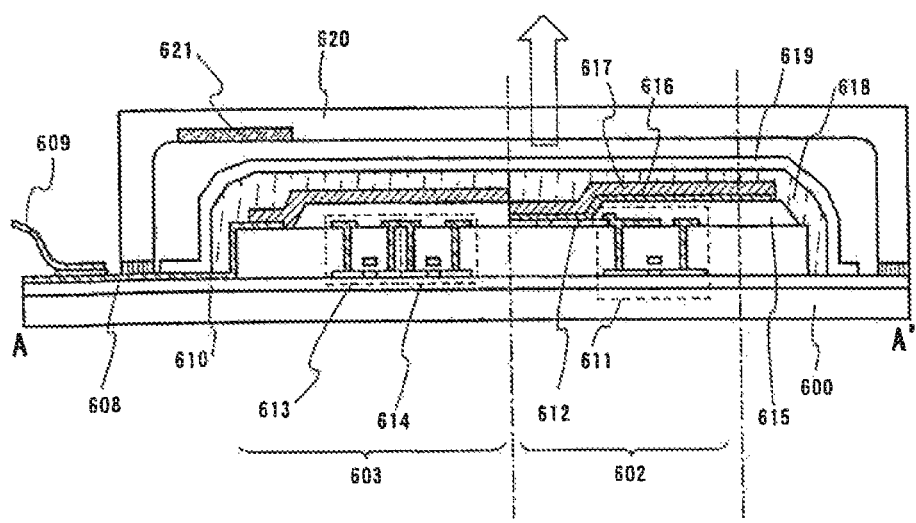
FIG. 15 is a diagram showing a module (Embodiment 3).

FIG. 6A is a top view of an EL module, and FIG. 14B is a cross-sectional view taken along the line A-A' of FIG. 14A. In FIG. 14A, a base insulating film 501 is formed on a substrate 500 (for example, a heat resistant glass), and a pixel portion 502, a source driving circuit 504, and a gate driving circuit 503 are formed thereon. These pixel portion and driving circuit may be obtained by Embodiment 1 or 2.

Reference numeral 518 is an organic resin, reference numeral 519 is a protective film, a pixel portion and a driving circuit are covered with the organic resin 518, and the organic resin 518 is covered with the protective film 518. In addition, the cover material may be used to seal using bonding material. The cover material may be bonded as a support medium before peeled off.

Wiring 508 for transmitting signals to be input to the source driving circuit 504 and the gate driving circuit 503 is provided. A video signal, a clock signal, etc., are received through the wiring 508 from a flexible printed circuit (FPC) 509 used as an external input terminal. Although only the FPC is illustrated, a printed wiring board (PWB) may be attached to the FPC. The light-emitting device described in this specification also comprises a combination of the light-emitting device main unit and the FPC or a PWB attached to the main unit.

The structure of this embodiment as seen in the sectional view of FIG. 14B will next be described. A base insulating film 501 is provided on the substrate 500, and the pixel portion 502 and the gate driving circuit 503 are formed on the insulating film 501. The pixel portion 502 is constituted by current control TFTs 511 and a plurality of pixels including pixel electrodes 512 electrically connected to the drains of the current control TFTs 511. The gate driving circuit 503 is formed by using a CMOS circuit including a combination of an n-channel TFT 513 and a p-channel TFT 514.

TFTs in these circuits (including TFTs 511, 513, and 514) may be manufactured in accordance with the n-channel TFT and the p-channel TFT of Embodiment 1.

Each pixel electrode 512 functions as an cathode of a light emitting element. Banks 515 are formed at the opposite ends of the pixel electrode 512. An organic compound layer 516 and a anode 517 of the light emitting element are formed on the pixel electrode 512.

An organic compound layer 516 (a layer for light emission and for moving of carriers to cause light emission) has a light emitting layer and a free combination of electric charge transporting layers and electric charge injection layers. For example, a low molecular weight organic compound material or a high molecular weight organic compound material is used to form an organic compound layer. An organic compound layer 516 may be a thin film formed of a light emitting material that emits light by singlet excitation (fluorescence) (a singlet compound) or a thin film formed of a light emitting material that emits light by triplet excitation (phosphorescence) (a triplet compound). Inorganic materials such as silicon carbide may be used for the electric charge transporting layers and electric charge injection layers. Known organic materials and inorganic materials can be employed.

The anode 517 also functions as a wiring connected in common to all the pixels. The anode 517 is electrically connected to the FPC 509 via connection wiring 508. All the devices contained in the pixel portion 502 and the gate driving circuit 503 are covered with the anode 517, the organic resin 518 and the protective film 519.

Preferably, a material having the highest possible transparency or translucence for visible light is used as the sealing material 518. Also, preferably, the sealing material 518 has the highest possible effect of limiting permeation of water and oxygen.

It is also preferable to provide the protective film 519 formed of a DLC film or the like at least on the surface of the sealing material 518 (exposed surface), as shown in FIGS. 14A and 14B, after the light-emitting device has been completely covered with the sealing material 518. The protective film may be provided on the entire surface including the back surface of the substrate. In such a case, care must be exercised to avoid forming the protective film on the region where external input terminal (FPC) is provided. To avoid film forming on the external input terminal region, a mask may be used or the terminal region may be covered with a tape such as a Teflon tape (registered mark) used as a masking tape in CVD apparatus. For forming the protective film 519, a silicon nitride film, DLC film, or AlNxOy film may be used.

The light emitting device is enclosed in the above-described structure with the protective film 519 to completely isolate the light emitting device from the outside and to prevent substances which promote degradation of the organic compound layer by oxidation, e.g., water and oxygen from entering the light emitting device from the outside. Thus, the light emitting device having improved reliability can be obtained.

Another arrangement is conceivable in which a pixel electrode is used as a cathode and an organic compound layer and an anode having property of transmittivity are formed in combination to emit light in a direction opposite to the direction indicated in FIG. 14. FIG. 15 shows an example of such an arrangement. This arrangement can be illustrated in the same top view as FIG. 14 and will therefore be described with reference to a cross-sectional view only.

The structure shown in the cross-sectional view of FIG. 15 will be described. An insulating film 610 is formed on a film substrate 600, and a pixel portion 602 and a gate-side drive circuit 603 are formed over the insulating film 610. The pixel portion 602 is formed by a plurality of pixels including a current control TFT 611 and a pixel electrode 612 electrically connected to the drain of the current control TFT 611. A gate-side drive circuit 603 is formed by using a CMOS circuit having a combination of an n-channel TET 613 and a p-channel TFT 614.

These TFTs (611, 613, 614, etc.) may be fabricated in the same manner as the n-channel TFT and the p-channel TFT of Embodiment 1.

The pixel electrode 612 functions as an anode of the light emitting element. Banks 615 are formed at opposite ends of the pixel electrode 612, and an organic compound layer 616 and a cathode 617 of the light emitting element are formed over the pixel electrode 612.

The cathode 617 also functions as a common wiring element connected to all the pixels and is electrically connected to a FPC 609 via connection wiring 608. All the elements included in the pixel portion 602 and the gate-side drive circuit 603 are covered with the cathode 617, an organic resin 618 and a protective film 619. A cover member 620 is bonded to the element layer by an adhesive. A recess is formed in the cover member and a desiccant 621 is set therein.

In the arrangement shown in FIG. 15, the pixel electrode is used as the anode while the organic compound layer and the cathode are formed in combination, so that light is emitted in the direction of the arrow in FIG. 15.

While the top gate TFTs have been described by way of example, the present invention can be applied irrespective of the TFT structure. For example, the present invention can be applied to bottom gate (inverted staggered structure) TFTs and staggered structure TFTs.

Embodiment 4

All of the electronic equipments incorporated various modules (active matrix EL module) having OLED are completed by implementing the present invention.

Following can be given as such electronic equipments: video cameras; digital cameras; head mounted displays (goggle type displays); car navigation systems; projectors;

car stereos; personal computers; portable information terminals (mobile computers, mobile phones or electronic books etc.) etc. Examples of these are shown in FIGS. 16 and 17.

Figure 16A:
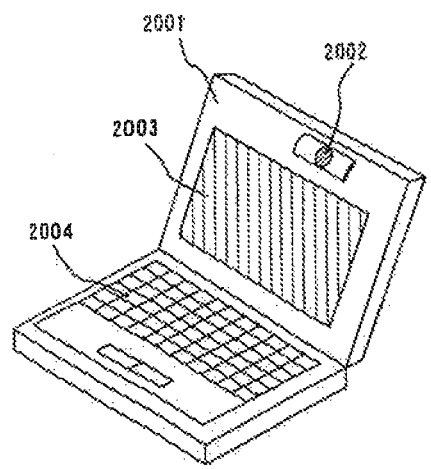
FIGS. 16A through 16F are diagrams showing electronics (Embodiment 4).

FIG. 16A is a personal computer which comprises: a main body 2001; an image input section 2002; a display section 2003; and a keyboard 2004 etc.

Figure 16B:
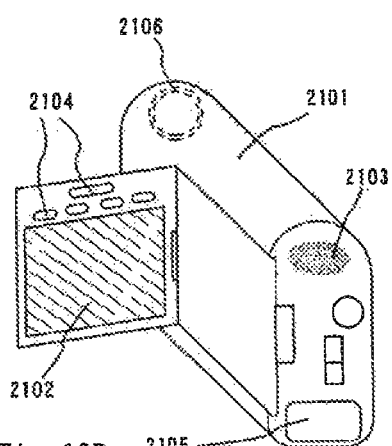

FIG. 16B is a video camera which comprises: a main body 2101; a display section 2102; a voice input section 2103; operation switches 2104; a battery 2105 and an image receiving section 2106 etc.

Figure 16C:
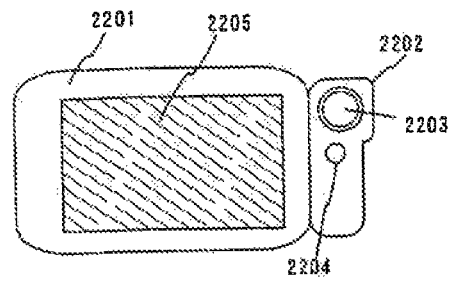

FIG. 16C is a mobile computer which comprises: a main body 2201; a camera section 2202; an image receiving section 2203; operation switches 2204 and a display section 2205 etc.

Figure 16D:
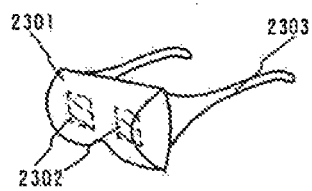

FIG. 16D is a goggle type display which comprises: a main body 2301; a display section 2302; and an arm section 2303 etc.

Figure 16E:
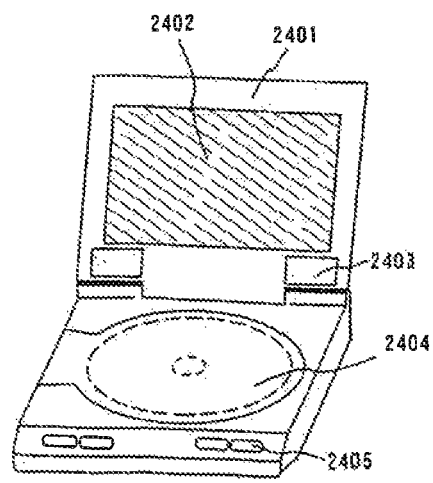

FIG. 16E is a player using a recording medium in which a program is recorded (hereinafter referred to as a recording medium) which comprises: a main body 2401; a display section 2402; a speaker section 2403; a recording medium 2404; and operation switches 2405 etc. This apparatus uses DVD (digital versatile disc), CD, etc. for the recording medium, and can perform music appreciation, film appreciation, games and use for Internet.

Figure 16F:
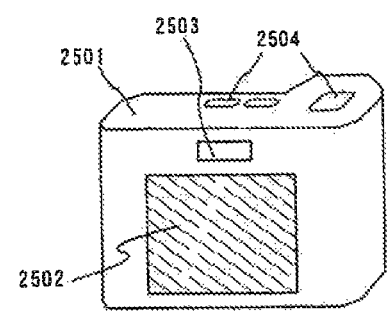

FIG. 16F is a digital camera which comprises: a main body 2501; a display section 2502; a view finder 2503; operation switches 2504; and an image receiving section (not shown in the figure) etc.

Figure 17A:
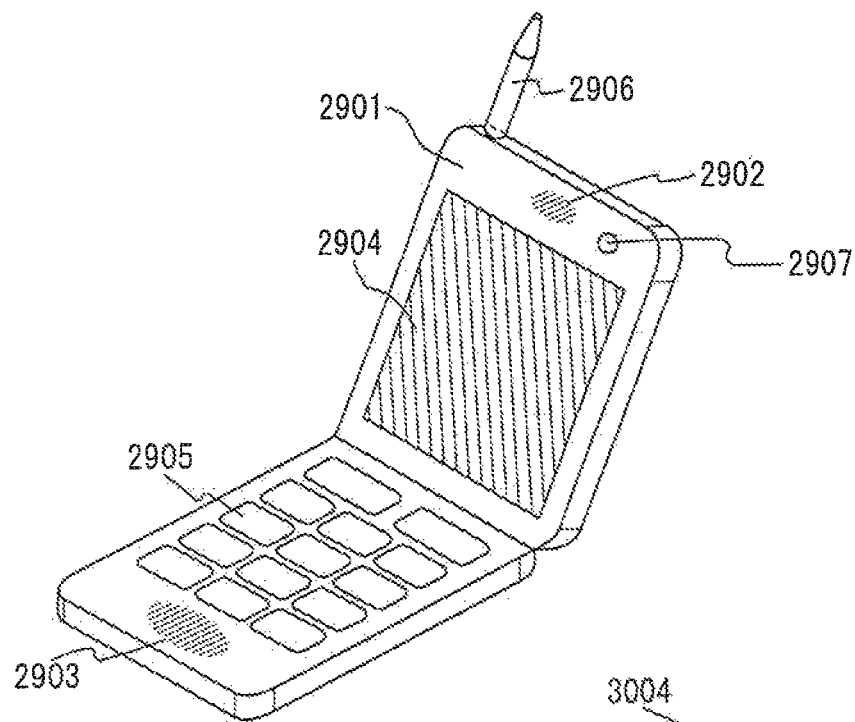
FIGS. 17A through 17C are diagrams showing electronics (Embodiment 4).

FIG. 17A is a mobile phone which comprises: a main body 2901; a voice output section 2902; a voice input section 2903; a display section 2904; operation switches 2905; an antenna 2906; and an image input section (CCD, image sensor, etc.) 2907 etc.

Figure 17B:
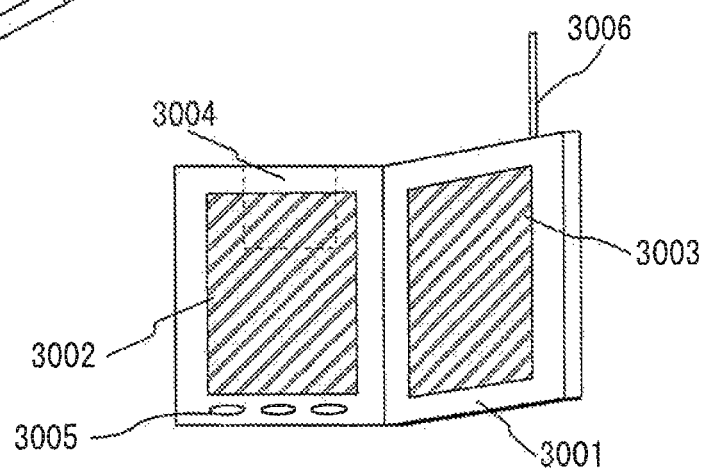

FIG. 17B is a portable book (electronic book) which comprises: a main body 3001; display sections 3002 and 3003; a recording medium 3004; operation switches 3005 and an antenna 3006 etc.

Figure 17C:
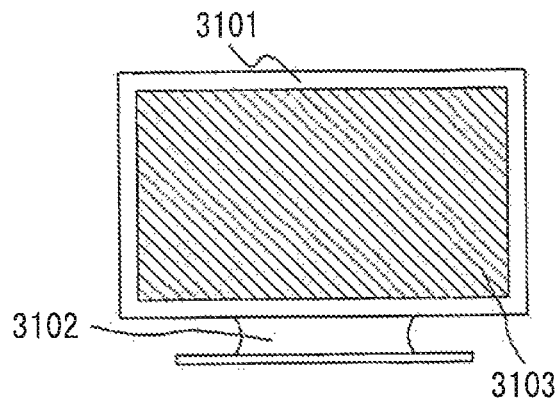
Figure 18:
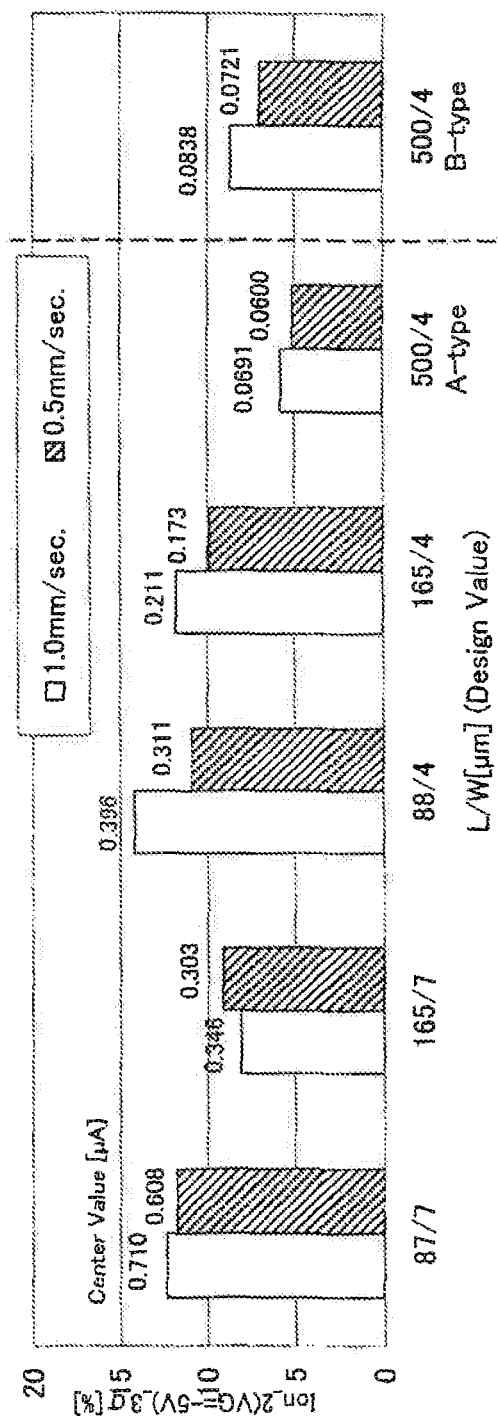
FIG. 18 is a diagram showing relationship between TFT size of the present invention and the dispersion of on-current (at Vg=−5 V).
Figure 19:
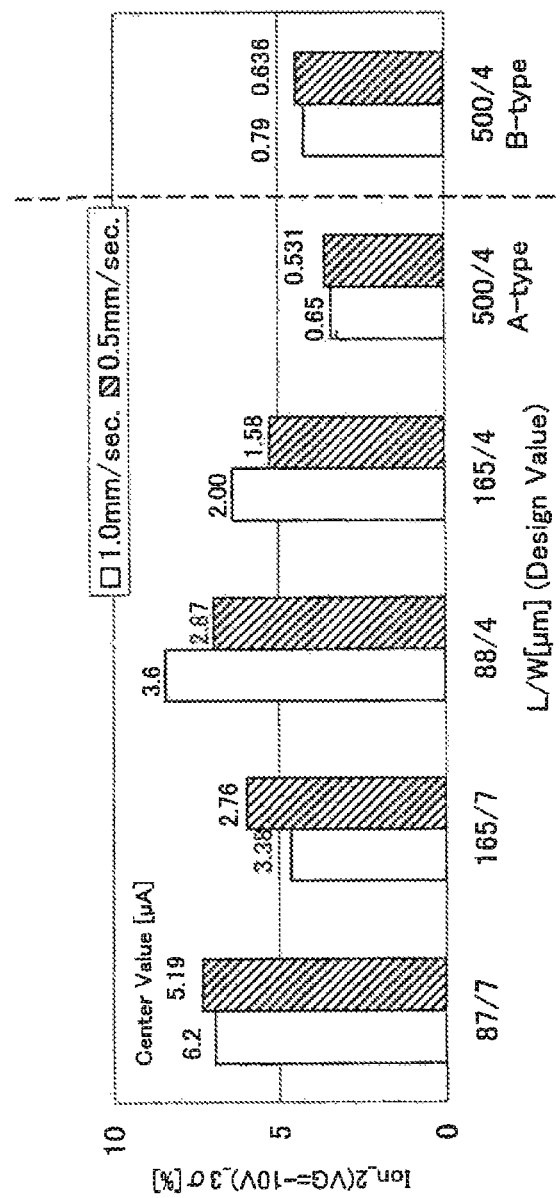
FIG. 19 is a diagram showing relationship between TFT size of the present invention and the dispersion of on-current (at Vg=−10 V).
Figure 20:
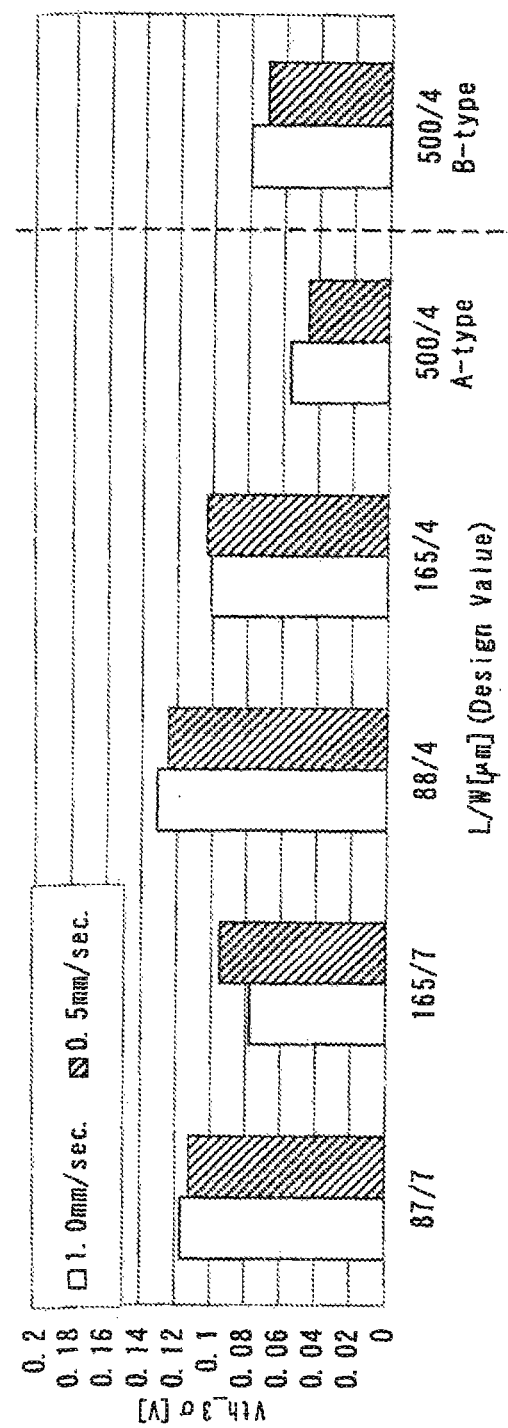
FIG. 20 is a diagram showing relationship between TFT size of the present invention and the dispersion of threshold voltage.
Figure 21:
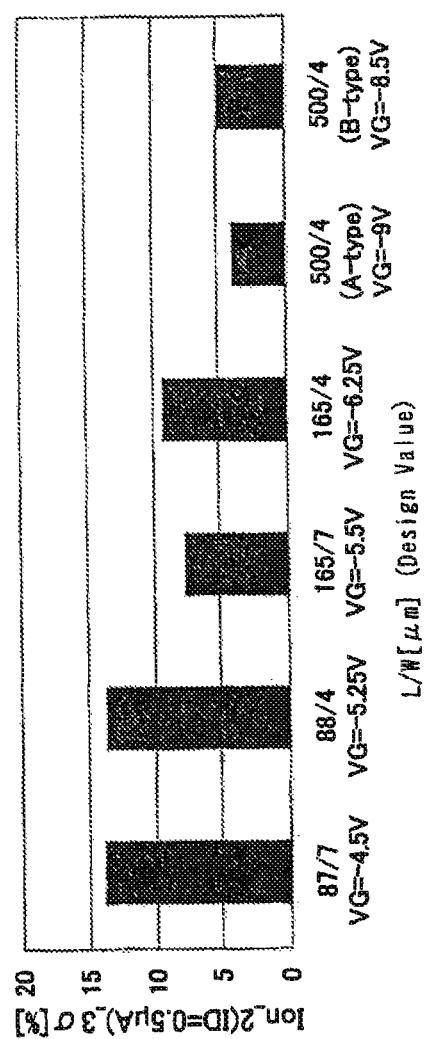
FIG. 21 is a diagram showing relationship between TFT size of the present invention and the dispersion of on-current at a constant current value (Id=0.5 µA).

FIG. 17C is a display which comprises: a main body 3101; a supporting section 3102; and a display section 3103 etc.

In addition, the display shown in FIG. 17C has small and medium-sized or large-sized screen, for example a size of 5 to 20 inches. Further, to manufacture the display part with such sizes, it is preferable to mass-produce by gang printing by using a substrate with one meter on a side.

As described above, the applicable range of the present invention is extremely large, and the invention can be applied to electronic equipments of various areas. Note that the electronic devices of this embodiment can be achieved by utilizing any combination of constitutions in Embodiments 1 to 3.

According to the present invention, in a pixel portion where a plurality of TFTs are arranged, in the TFTs that supply currents to the OLED, not only simple dispersion of on-current but also normalized dispersion thereof can be reduced, resulting in particularly reducing the dispersion of the brightness of a display device having the OLED.

Furthermore, according to the present invention, even when the dispersion in the TFT fabrication process such as illumination conditions of the laser light or the like is caused, the dispersion of the electric characteristics between the TFTs can be reduced.

Still furthermore, according to the present invention, other than the reduction of the dispersion between the individual TFTs, the dispersion of the OLED itself caused by an area contraction of the EL layer due to the patterning and the heat treatment can be reduced.

Furthermore, according to the present invention, other than the reduction of the dispersion between the individual TFTs, even when the OLED is deteriorated for some reason, the current flowing to the OLED can be maintained constant, resulting in maintaining a constant brightness.

Still furthermore, according to the present invention, since part of the capacitance $C_{ox}$ of the TFT can be intentionally used as the retention capacitance, simplification of the pixel structure and an improvement in the open area ratio can be attained.

What is claimed is:

1. A light emitting device comprising:
   a semiconductor film including a channel formation region, a source region, and a drain region;
   a first insulating film over the semiconductor film;
   a gate electrode over the first insulating film;
   a second insulating film over the gate electrode;
   a power supply line over the second insulating film, the power supply line being electrically connected to one of the source region and the drain region;
   a source wiring over the second insulating film, the source wiring including a region overlapping with the semiconductor film; and
   a light-emitting element electrically connected to the other of the source region and the drain region,
   wherein a capacitance is formed in a region overlapping with the channel formation region by arranging the gate electrode, the second insulating film, and the power supply line in this order,
   wherein an end portion of the channel formation region includes a first point and a second point which overlap with the gate electrode, and
   wherein a length connecting the first point and the second point along a channel path is longer than a length connecting the first point and the second point by a straight line.

2. The light emitting device comprising according to claim 1, wherein the channel formation region comprises a rectangular shape.

3. The light emitting device comprising according to claim 1, wherein the channel formation region comprises a serpentine shape.

4. A light emitting device comprising:
   a semiconductor film including a channel formation region, a source region, and a drain region;
   a first insulating film over the semiconductor film;
   a gate electrode over the first insulating film;
   a second insulating film over the gate electrode;
   a power supply line over the second insulating film, the power supply line being electrically connected to one of the source region and the drain region;
   a source wiring over the second insulating film, the source wiring including a region overlapping with the semiconductor film; and
   a light-emitting element electrically connected to the other of the source region and the drain region,
   wherein a capacitance is formed in a region overlapping with the channel formation region by arranging the gate electrode, the second insulating film, and the power supply line in this order, and
   wherein the channel formation region comprises at least one of corner portions in a region overlapping with the gate electrode.

5. The light emitting device comprising according to claim 4, wherein the channel formation region comprises a rectangular shape.

6. The light emitting device comprising according to claim 4, wherein the channel formation region comprises a serpentine shape.

* * * * *